US012745678B2

(12) United States Patent
Ji et al.

(10) Patent No.: US 12,745,678 B2
(45) Date of Patent: Sep. 22, 2026

(54) SEMICONDUCTOR PACKAGE

(71) Applicant: SAMSUNG ELECTRONICS CO., LTD., Suwon-si (KR)

(72) Inventors: Minseung Ji, Suwon-si (KR); Seungduk Baek, Suwon-si (KR); Aenee Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 367 days.

(21) Appl. No.: 18/387,656

(22) Filed: Nov. 7, 2023

(65) Prior Publication Data

US 2024/0153898 A1 May 9, 2024

(30) Foreign Application Priority Data

Nov. 7, 2022 (KR) ........................ 10-2022-0147394

(51) Int. Cl.
*H10W 72/90* (2026.01)
*H10W 90/00* (2026.01)
(Continued)

(52) U.S. Cl.
CPC ............ *H10W 90/00* (2026.01); *H10W 72/90* (2026.01); *H10W 72/926* (2026.01); *H10W 72/932* (2026.01); *H10W 72/936* (2026.01); *H10W 72/944* (2026.01); *H10W 72/9445* (2026.01); *H10W 72/952* (2026.01); *H10W 80/701* (2026.01); *H10W 90/24* (2026.01);
(Continued)

(58) Field of Classification Search
CPC ........................ H01L 23/49838; H10W 72/932
See application file for complete search history.

(56) References Cited

U.S. PATENT DOCUMENTS 7,772,104 B2 8/2010 Pham et al.
8,047,421 B2 11/2011 Sri-Jayantha et al.
(Continued)

FOREIGN PATENT DOCUMENTS

CN 114765150 A 7/2022
JP 2009-218233 A 9/2009
(Continued)

OTHER PUBLICATIONS

Office Action dated Aug. 11, 2026 issued by Korean Patent Office in Application No. 10-2022-0147394.

*Primary Examiner* — Christopher A Johnson
(74) *Attorney, Agent, or Firm* — Sughrue Mion, PLLC

(57) ABSTRACT

A semiconductor package includes a lower chip including a first lower bonding pad and a second lower bonding pad, and an upper chip disposed on the lower chip, the upper chip including a first upper bonding pad and a second upper bonding pad respectively hybrid-bonded together. The first lower and upper bonding pads have a first shape in which first and second axis lengths are the same, and are disposed in a first center region of the chips. The second lower and upper bonding pads have a second shape in which third and fourth axis lengths differ, and are disposed in a first edge region which is near a corner point of the chip. In the second lower and upper bonding pads disposed in the first edge region, the third axis length is arranged in a direction perpendicular to a radial direction from the center point.

20 Claims, 18 Drawing Sheets

(51) Int. Cl.

| | |
|---|---|
| *H10W 80/00* | (2026.01) |
| *H10W 90/20* | (2026.01) |
| *H10W 90/24* | (2026.01) |
| *H10W 90/26* | (2026.01) |

(52) U.S. Cl.
CPC .......... *H10W 90/26* (2026.01); *H10W 90/297* (2026.01); *H10W 90/721* (2026.01); *H10W 90/792* (2026.01); *H10W 90/794* (2026.01)

(56) References Cited

U.S. PATENT DOCUMENTS

| | | | | |
|---|---|---|---|---|
| 10,734,343 | B2 | 8/2020 | Rinne et al. | |
| 11,056,464 | B2 | 7/2021 | Yu et al. | |
| 11,211,319 | B2 | 12/2021 | Fang et al. | |
| 11,335,656 | B2 | 5/2022 | Hu et al. | |
| 2008/0217384 | A1* | 9/2008 | Jayantha | B23K 1/0016 228/180.21 |
| 2019/0067169 | A1* | 2/2019 | Yu | H01L 21/56 |
| 2021/0175194 | A1 | 6/2021 | Yu et al. | |
| 2021/0305184 | A1 | 9/2021 | Zhang et al. | |
| 2022/0310503 | A1 | 9/2022 | Hsu et al. | |
| 2022/0415836 | A1* | 12/2022 | Kuo | H01L 24/06 |
| 2023/0395427 | A1* | 12/2023 | Liao | H01L 21/76816 |

FOREIGN PATENT DOCUMENTS

| | | | |
|---|---|---|---|
| KR | 10-2018-0018245 | A | 2/2018 |
| KR | 10-2021-0151569 | A | 12/2021 |

* cited by examiner

SEMICONDUCTOR PACKAGE

CROSS-REFERENCE TO RELATED APPLICATION

This application is based on and claims priority under 35 U.S.C. § 119 to Korean Patent Application No. 10-2022-0147394, filed on Nov. 7, 2022, in the Korean Intellectual Property Office, the disclosure of which being incorporated by reference herein in its entirety.

BACKGROUND

The present disclosure relates to a semiconductor package, and more particularly, to a semiconductor package which is provided by bonding a lower chip to an upper chip.

As multifunctional, high-capacity, and miniaturized electronic products are needed, semiconductor packages manufactured by bonding two or more semiconductor chips have been proposed. In such semiconductor packages, bonding reliability between two or more semiconductor chips is very important. When the bonding reliability of a semiconductor package is low, a case where the semiconductor package is incapable of performing a function thereof may occur.

SUMMARY

It is an aspect to provide a semiconductor package in which bonding reliability is enhanced.

According to an aspect of one or more embodiments, there is provided a semiconductor package comprising a lower chip including a lower bonding insulation layer, a first lower bonding pad, and a second lower bonding pad; and an upper chip disposed on the lower chip, the upper chip including an upper bonding insulation layer, a first upper bonding pad, and a second upper bonding pad respectively hybrid-bonded to the lower bonding insulation layer, the first lower bonding pad, and the second lower bonding pad, wherein each of the first lower bonding pad and the first upper bonding pad have a first shape in which a first axis length is the same as a second axis length one-dimensionally or planarily, and the first lower bonding pad and the first upper bonding pad are disposed in a first center region which is near a center point of the lower chip and the upper chip, each of the second lower bonding pad and the second upper bonding pad have a second shape in which a third axis length differs from a fourth axis length one-dimensionally or planarily, and the second lower bonding pad and the second upper bonding pad are disposed in a first edge region which is near a corner point of the lower chip and the upper chip, and the third axis length is greater than the first axis length, and in the second lower bonding pad and the second upper bonding pad disposed in the first edge region, the third axis length is arranged in a direction perpendicular to a radial direction from the center point.

According to another aspect of one or more embodiments, there is provided a semiconductor package comprising a lower chip including a lower bonding insulation layer, a first lower bonding pad, and a second lower bonding pad; and an upper chip disposed on the lower chip, the upper chip including an upper bonding insulation layer, a first upper bonding pad, and a second upper bonding pad respectively hybrid-bonded to the lower bonding insulation layer, the first lower bonding pad, and the second lower bonding pad, wherein the first lower bonding pad and the first upper bonding pad each have a circular shape and are one-dimensionally or planarily arranged in a first center region that is disposed near a center point of the lower chip and the upper chip, the second lower bonding pad and the second upper bonding pad each having an oval shape are one-dimensionally or planarily arranged in a perpendicular direction, which is perpendicular to a radial direction from the center point, the second lower bonding pad and the second upper bonding pad being disposed in a first edge region that is disposed near corner points of the lower chip and the upper chip, and a long-axis length of the oval shape is greater than a diameter of the circular shape, and the second lower bonding pad and the second upper bonding pad of the first edge region are arranged to be one-dimensionally or planarily staggered, and partially staggered in the perpendicular direction perpendicular to the radial direction from the center point.

According to yet another aspect of one or more embodiments, there is provided a semiconductor package comprising a lower chip including a lower bonding insulation layer, a first lower bonding pad, and a second lower bonding pad; and an upper chip disposed on the lower chip, the upper chip including an upper bonding insulation layer, a first upper bonding pad, and a second upper bonding pad respectively hybrid-bonded to the lower bonding insulation layer, the first lower bonding pad, and the second lower bonding pad, wherein the first lower bonding pad and the first upper bonding pad each having a tetragonal shape are one-dimensionally or planarily arranged in a first center region that is disposed near a center point of the lower chip and the upper chip, the second lower bonding pad and the second upper bonding pad each having a rectangular shape are one-dimensionally or planarily arranged in a perpendicular direction, which is perpendicular to a radial direction from the center point, the second lower bonding pad and the second upper bonding pad being disposed in a first edge region that is disposed near corner points of the lower chip and the upper chip, and a long-axis length of the rectangular shape is greater than an axis length of the tetragonal shape, and the second lower bonding pad and the second upper bonding pad of the first edge region are arranged to be one-dimensionally or planarily staggered, and partially staggered in the perpendicular direction perpendicular to the radial direction from the center point.

BRIEF DESCRIPTION OF THE DRAWINGS

The above and other aspects will be more clearly understood from the following detailed description taken in conjunction with the accompanying drawings, in which.

DETAILED DESCRIPTION

Hereinafter, various embodiments will be described in detail with reference to the accompanying drawings. The following embodiments may be implemented as only arbitrary one embodiment, and the following embodiments may also be implemented by a combination of one or more embodiments. Therefore, it is not construed that the present disclosure is limited to one embodiment. Herein, a singular form of elements may include a plural form unless another case is clearly designated in context. The drawings for more clearly describing the various embodiments are exaggerated and illustrated.

It can be understood that when an element is referred to with terms such as "first" and "second", the element is not limited thereby. The terms "first" and "second" may be used only for a purpose of distinguishing the element from the other elements, and may not limit the sequence or importance of the elements. In some cases, a "first" element may be referred to as a "second" element without departing from the scope of the claims set forth herein. Similarly, a "second" element may also be referred to as a "first" element.

Figure 1:
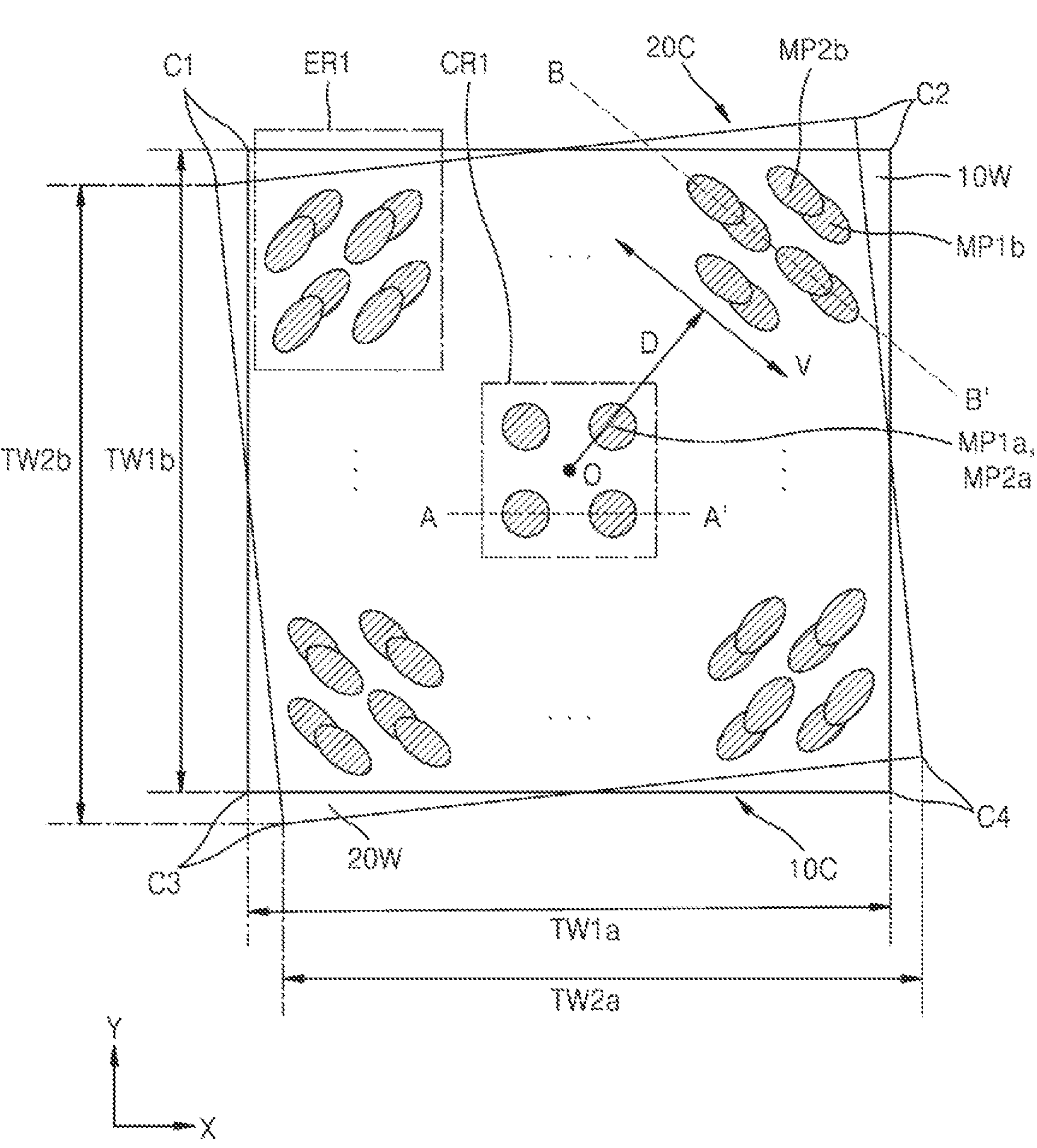
FIG. 1 is a plan view illustrating a semiconductor package according to some embodiments.

FIG. 1 is a plan view illustrating a semiconductor package 100 according to some embodiments.

In detail, the semiconductor package 100 may have a structure where a lower chip 10C is hybrid-bonded to an upper chip 20C. The semiconductor package 100 may have a structure where the upper chip 20C is stacked on and hybrid-bonded to the lower chip 10C.

The lower chip 10C may include a first substrate 10W. The upper chip 20C may include a second substrate 20W. A vertical structure of hybrid bonding between the lower chip 10C and the upper chip 20C will be described below. In FIG. 1, each of an X direction and a Y direction may be a direction parallel to a surface of each of the lower chip 10C and the upper chip 20C.

The lower chip 10C may have a first length TW1*a* in the X direction and a second length TW1*b* in the Y direction. The upper chip 20C may have a third length TW2*a* in the X direction and a fourth length TW2*b* in the Y direction. The first length TW1*a* and the second length TW1*b* may respectively be the same as the third length TW2*a* and the fourth length TW2*b*. The first length TW1*a*, the second length TW1*b*, the third length TW2*a*, and the fourth length TW2*b* may be variously changed based on a package structure.

The lower chip 10C and the upper chip 20C may include a first center region CR1 disposed near a center point O thereof. A lower bonding pad MP1*a* and an upper bonding pad MP2*a* each having a first shape (e.g., a circular shape) may be one-dimensionally or planarily disposed in the first center region CR1. The lower bonding pad MP1*a* and the upper bonding pad MP2*a* each having the first shape (e.g., a circular shape) may be disposed in the first center region CR1 on an X-Y plane.

Figure 5:
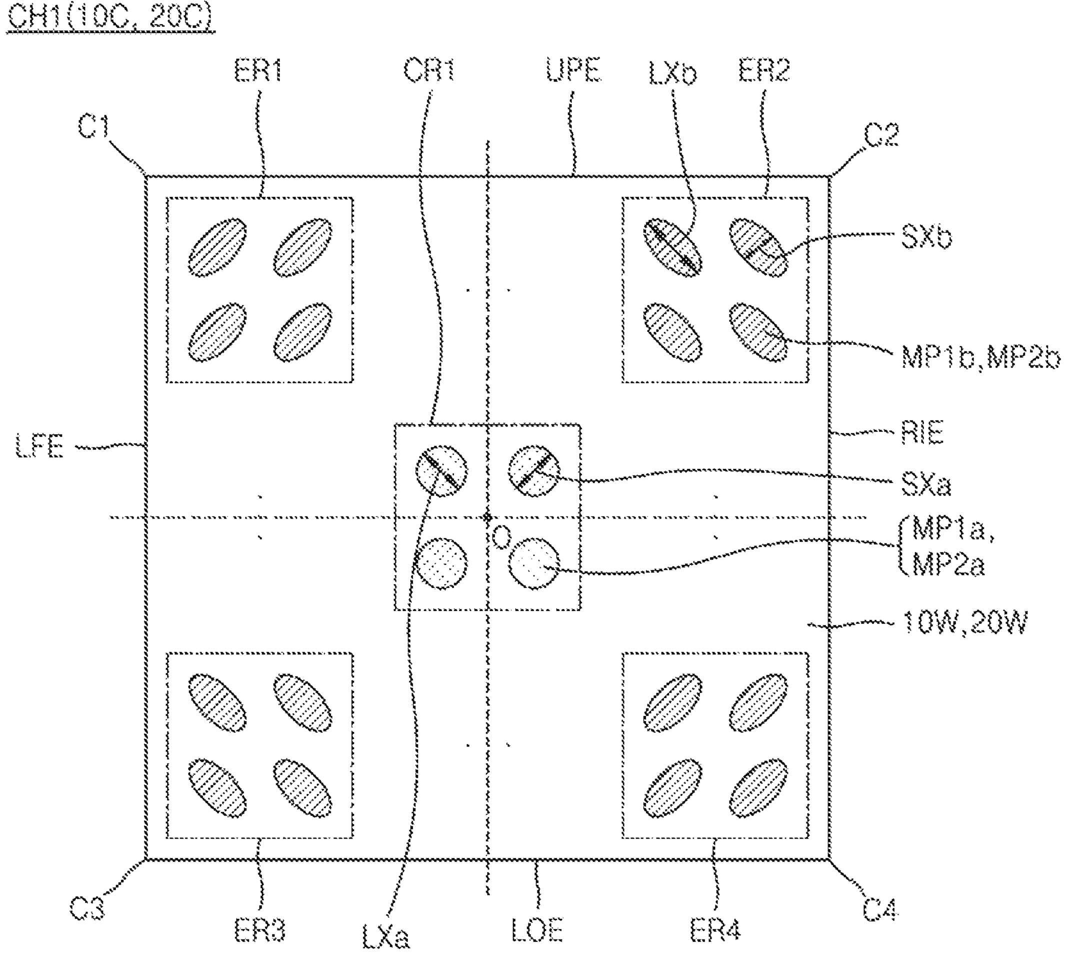
FIG. 5 is a plan view for describing a lower chip and an upper chip of the semiconductor package of FIG. 1, according to some embodiments.

In the lower bonding pad MP1*a* and the upper bonding pad MP2*a* each having the first shape (e.g., a circular shape), a first axis length (LXa of FIG. 5) may be the same as a second axis length (SXa of FIG. 5). The lower bonding pad MP1*a* and the upper bonding pad MP2*a* each having the first shape (e.g., a circular shape) may have the same diameter, and thus, the first axis length (LXa of FIG. 5) may be the same as the second axis length (SXa of FIG. 5).

The lower chip 10C and the upper chip 20C may include a first edge region ER1 disposed near corner points C1 to C4. In FIG. 1, for convenience, only a left first edge region ER1 disposed at a left corner point C1 is illustrated. A lower bonding pad MP1*b* and an upper bonding pad MP2*b* each having a second shape (e.g., an oval shape) may be one-dimensionally or planarily disposed in the first edge region ER1. The lower bonding pad MP1*b* and the upper bonding pad MP2*b* each having the second shape (e.g., an oval shape) may be disposed in the first edge region ER1 on the X-Y plane.

In the lower bonding pad MP1*b* and the upper bonding pad MP2*b* each having the second shape (e.g., an oval shape), a third axis length (LXb of FIG. 5) may be the same as a fourth axis length (SXb of FIG. 5). In the lower bonding pad MP1*b* and the upper bonding pad MP2*b* each having the second shape (e.g., an oval shape), the third axis length (LXb of FIG. 5) may be greater than the fourth axis length (SXb of FIG. 5). The third axis length (LXb of FIG. 5) may be greater than the first axis length (LXa of FIG. 5) and the second axis length (SXa of FIG. 5). In the lower bonding pad MP1*b* and the upper bonding pad MP2*b* of the first edge region ER1 of the lower chip 10C and the upper chip 20C, the third axis length (LXb of FIG. 5) of an oval shape may be arranged in a perpendicular direction (a V direction) perpendicular to a radial direction (a D direction) from the center point O.

One of the lower bonding pad MP1*b* and the upper bonding pad MP2*b* of the first edge region ER1 of the lower chip 10C and the upper chip 20C may be rotated clockwise or counterclockwise with respect to the center point O. For example, the upper bonding pad MP2*b* of the first edge region ER1 of the upper chip 20C may be rotated counterclockwise with respect to the center point O, on the lower chip 10C. In other words, assuming the center point O is a center of hands of an imaginary clock, the upper bonding pad MP2*b* may be rotated counterclockwise with respect to the lower bonding pad MP1*b* such that the upper bonding pad MP2*b* of the first edge region ER1 of the upper chip 20C may not accurately be aligned and may be misaligned with the lower bonding pad MP1*b* of the first edge region ER1 of the lower chip 10C one-dimensionally or planarily.

In other words, the upper bonding pad MP2*b* of the first edge region ER1 of the upper chip 20C may partially overlap and may be disposed to be staggered with the lower bonding pad MP1*b* of the first edge region ER1 of the lower chip 10C one-dimensionally or planarily. The upper bonding pad MP2*b* of the first edge region ER1 of the upper chip 20C may be easily connected with the lower bonding pad MP1*b* of the first edge region ER1 of the lower chip 10C one-dimensionally or planarily.

As described above, in the semiconductor package 100, the upper bonding pad MP2*b* and the lower bonding pad MP1*b* of the first edge region ER1 of the upper chip 20C may be implemented in the second shape (for example, an oval shape) where long-axis lengths differ, and thus, a misalign margin may increase in hybrid-bonding the upper chip 20C to the lower chip 10C, thereby enhancing bonding reliability.

Figure 2:
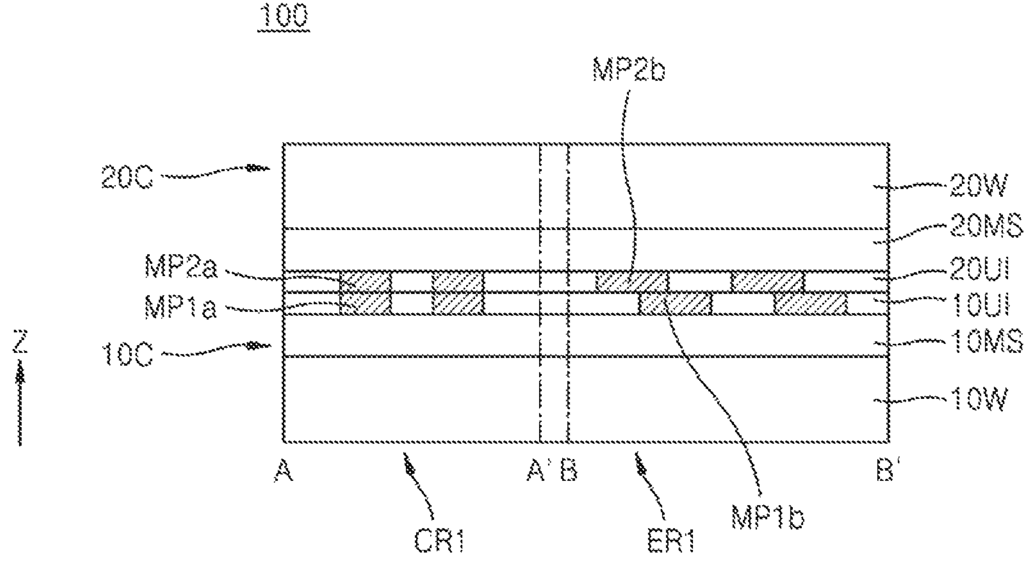
FIG. 2 is a cross-sectional view taken along line A-A' and line B-B' of FIG. 1.
Figure 3:
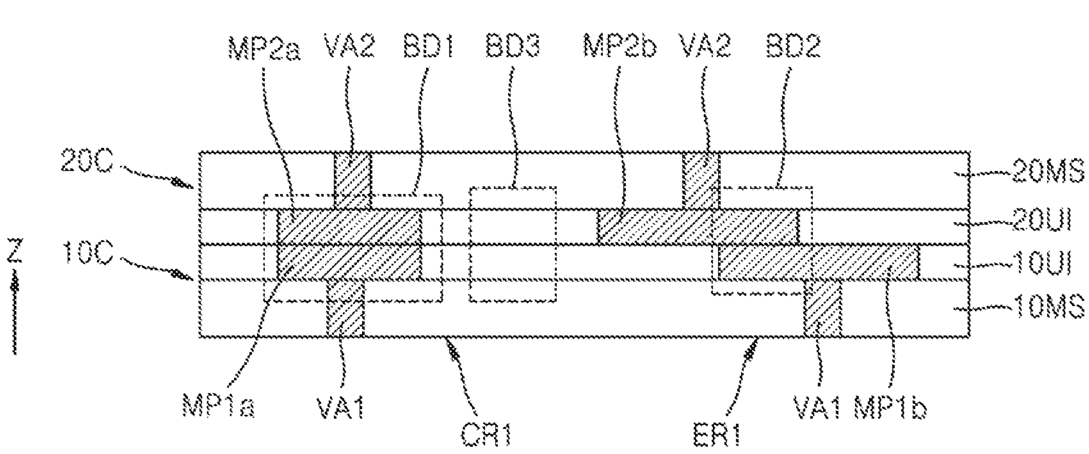
FIG. 3 is a partial enlarged view for describing hybrid bonding of FIG. 2.

FIG. 2 is a cross-sectional view taken along line A-A' and line B-B' of FIG. 1, and FIG. 3 is a partial enlarged view for describing hybrid bonding of FIG. 2, according to some embodiments.

In detail, FIGS. 2 and 3 are provided for describing a vertical structure of the lower chip 10C and the upper chip 20C of the semiconductor package 100. In FIGS. 2 and 3, a Z direction may be a direction perpendicular to the surface of each of the lower chip 10C and the upper chip 20C.

The lower chip 10C may include the first substrate 10W and a first wiring structure 10MS disposed on the first substrate 10W. A first via wiring layer VA1, as illustrated in FIG. 3, may be disposed in the first wiring structure TOMS. The upper chip 20C may include the second substrate 20W and a second wiring structure 20MS disposed on the second substrate 20W. A second via wiring layer VA2, as illustrated in FIG. 3, may be disposed in the second wiring structure 20MS.

The first substrate 10W and the second substrate 20W may be formed based on a Group-III-V compound wafer or a Group-IV material wafer such as a silicon wafer. The first substrate 10W and the second substrate 20W may include a single-crystal wafer such as a silicon single-crystal wafer.

The first substrate 10W and the second substrate 20W are not limited to the single-crystal wafer, and various wafers such as an epitaxial wafer, a polished wafer, an annealed wafer, and a silicon on insulator (SOI) wafer may be used as the first substrate 10W and the second substrate 20W. The epitaxial wafer may be a wafer which is formed by growing a crystalline material on a single-crystal silicon substrate.

The first substrate 10W and the second substrate 20W may include an impurity-doped well or an impurity-doped structure. The first substrate 10W and the second substrate 20W may include various device isolation structures such as a shallow trench isolation (STI) structure.

Each of the lower chip 10C and the upper chip 20C may include various kinds of individual devices. The individual devices may include various microelectronic devices, and for example, may include a metal-oxide-semiconductor field effect transistor (MOSFET) such as complementary metal-insulator-semiconductor (CMOS) transistor, system large scale integration (LSI), an image sensor such as a CMOS imaging sensor (CIS), a micro-electro-mechanical system (MEMS), an active device, and a passive device.

In some embodiments, each of the lower chip 10C and the upper chip 20C may be one of dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip.

The lower chip 10C may include the lower bonding pads MP1*a* and MP1*b* and a lower bonding insulation layer 10UI. The lower bonding insulation layer 10UI may be disposed to insulate the lower bonding pad MP1*a* from the lower bonding pad MP1*b* and surround the lower bonding pads MP1*a* and MP1*b*. The lower bonding pads MP1*a* and MP1*b* may include the lower bonding pad MP1*a* provided in the first center region CR1 and the lower bonding pad MP1*b* disposed in the first edge region ER1.

The upper chip 20C may include the upper bonding pads MP2*a* and MP2*b* and an upper bonding insulation layer 20UI. The upper bonding insulation layer 20UI may be disposed to insulate the upper bonding pad MP2*a* from the upper bonding pad MP2*b* and surround the upper bonding pads MP2*a* and MP2*b*. The upper bonding pads MP2*a* and MP2*b* may include the upper bonding pad MP2*a* provided in the first center region CR1 and the upper bonding pad MP2*b* disposed in the first edge region ER1.

The lower bonding pads MP1*a* and MP1*b* and the upper bonding pads MP2*a* and MP2*b* may each include a metal layer, (for example, copper, aluminum, silver, cobalt, ruthenium, or an alloy thereof). The lower bonding insulation layer 10UI and the upper bonding insulation layer 20UI may each include a dielectric layer. The lower bonding insulation layer 10UI and the upper bonding insulation layer 20UI may each include silicon oxide ($SiO_2$), carbon-doped silicon oxide (C-doped $SiO_2$), silicon nitride (SiN), silicon carbide nitride (SiCN), or a polymer.

As illustrated in FIGS. 2 and 3, the lower bonding pad MP1*a* and the upper bonding pad MP2*a* of the first center region CR1 may be disposed to vertically overlap each other. The lower bonding pad MP1*a* and the upper bonding pad MP2*a* of the first center region CR1 may be vertically and accurately aligned and connected with each other.

As illustrated in FIGS. 2 and 3, the lower bonding pad MP1*b* and the upper bonding pad MP2*b* of the first edge region ER1 may be disposed to vertically and partially overlap each other and to be staggered. The lower bonding pad MP1*b* and the upper bonding pad MP2*b* of the first edge region ER1 may be vertically misaligned, but as described above, may be implemented in the second shape (e.g., an oval shape) and connected with each other.

The semiconductor package 100, as described above, may have a structure where the upper chip 20C is stacked on and hybrid-bonded to the lower chip 10C. Hybrid bonding may denote bonding of the lower bonding pad MP1*a* and the upper bonding pad MP2*a*, bonding of the lower bonding pad MP1*b* and the upper bonding pad MP2*b*, and simultaneous bonding of the lower bonding insulation layer 10UI and the upper bonding insulation layer 20UI.

The hybrid bonding may be performed through thermal treatment in a state where the lower bonding pad MP1*a* is adhered to the upper bonding pad MP2*a*, the lower bonding pad MP1*b* is adhered to the upper bonding pad MP2*b*, and the lower bonding insulation layer 10UI is adhered to the upper bonding insulation layer 20UI. The hybrid bonding may include a first hybrid bonding portion BD1, a second hybrid bonding portion BD2, and a third hybrid bonding portion BD3.

The first hybrid bonding portion BD1 may be a portion where the lower bonding pad MP1*a* and the upper bonding pad MP2*a* of the first center region CR1 are bonded to each other. The second hybrid bonding portion BD2 may be a portion where the lower bonding pad MP1*b* and the upper bonding pad MP2*b* of the first edge region ER1 are bonded to each other. The third hybrid bonding portion BD3 may be a portion where the lower bonding insulation layer 10UI and the upper bonding insulation layer 20UI of the first center region CR1 and the first edge region ER1 are bonded to each other.

Figure 4:
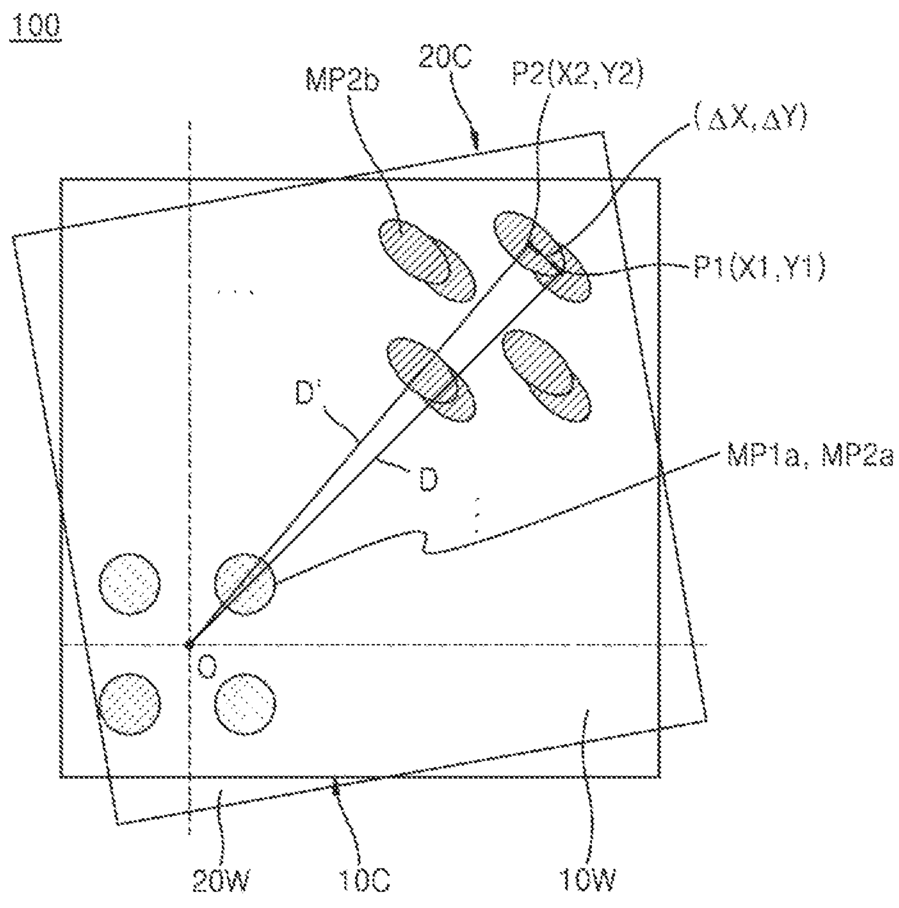
FIG. 4 is a partial enlarged plan view for describing the arrangement of bonding pads of the semiconductor package of FIG. 1, according to some embodiments.

FIG. 4 is a partial enlarged plan view for describing the arrangement of bonding pads of the semiconductor package 100 of FIG. 1, according to some embodiments.

In detail, in FIG. 4, the descriptions repetitive of those related to FIG. 1 will be simply given or be omitted for conciseness. A semiconductor package 100 may have a structure where an upper chip 20C is stacked on and hybrid-bonded to a lower chip 10C. The lower chip 10C may include a first substrate 10W. The upper chip 20C may include a second substrate 20W.

In the lower chip 10C and the upper chip 20C, a lower bonding pad MP1*a* and an upper bonding pad MP2*a* each having a first shape (e.g., a circular shape) may be one-dimensionally or planarily disposed in a first center region (CR1 of FIG. 1) near a center point O thereof. In the lower chip 10C and the upper chip 20C, a lower bonding pad MP1*b* and an upper bonding pad MP2*b* each having a second shape (e.g., an oval shape) may be one-dimensionally or planarily disposed in a first edge region (ER1 of FIG. 1) near corner points (C1 to C4 of FIG. 4).

The upper bonding pad MP2*b* of the first edge region ER1 of the upper chip 20C may be rotated counterclockwise with respect to the center point O, on the lower chip 10C. Therefore, a second center position P2(X2, Y2) of the upper bonding pad MP2*b* of the first edge region ER1 of the upper chip 20C may move from a first center position P1(X1, Y1) of the lower bonding pad MP1*b* of the first edge region ER1 of the lower chip 10C. A distance between the first center position P1 and the second center position P2 may be (ΔX, ΔY). In FIG. 4, each of a D direction and a D' direction may be a radial direction from the center point O of the lower chip 10C and the upper chip 20C to the first center portion P1(X1,Y1) and to the second center position P2(X2,Y2) respectively.

FIG. 5 is a plan view for describing a lower chip and an upper chip of the semiconductor package 100 of FIG. 1, according to some embodiments.

In detail, in FIG. 5, the descriptions repetitive of those related to FIG. 1 will be simply given or be omitted for conciseness. As described above, a semiconductor package (100 of FIG. 1) may include a lower chip 10C and an upper chip 20C. In FIG. 5, the lower chip 10C and the upper chip 20C may be the same chip. Therefore, the lower chip 10C and the upper chip 20C may be referred to as a first semiconductor chip CH1.

The first semiconductor chip CH1 may have a tetragonal shape. The first semiconductor chip CH1 may include substrates 10W and 20W. The first semiconductor chip CH1 may include corner points C1 to C4 and edges LFE, RIE, UPE, and LOE. The corner points C1 to C4 may include a left upper corner point C1, a right upper corner point C2, a left lower corner point C3, and a right lower corner point C4. The edges LFE, RIE, UPE, and LOE may include a left edge LFE, a right edge RIE, an upper edge UPE, and a lower edge LOE.

In the first semiconductor chip CH1, a lower bonding pad MP1*a* and an upper bonding pad MP2*a* each having a first shape (e.g., a circular shape) may be one-dimensionally or planarily disposed in a first center region CR1 near a center point O thereof. The lower bonding pad MP1*a* and the upper bonding pad MP2*a* of the first center region CR1 may have the first axis length LXa and the second axis length SXa. The first axis length LXa may be the same as the second axis length SXa.

The first semiconductor chip CH1 may include first edge regions ER1 to ER4 disposed near the corner points C1 to C4. The first edge regions ER1 to ER4 may include a left upper edge region ER1 adjacent to the left upper corner point C1, a right upper edge region ER2 adjacent to the right upper corner point C2, a left lower edge region ER3 adjacent to the left lower corner point C3, and a right lower edge region ER4 adjacent to the right lower corner point C4. A lower bonding pad MP1*b* and an upper bonding pad MP2*b* each having a second shape (e.g., an oval shape) may be one-dimensionally or planarily disposed in the first edge regions ER1 to ER4.

The lower bonding pad MP1*b* and the upper bonding pad MP2*b* of the first edge regions ER1, ER2, ER3, and ER4 may have a third axis length LXb and a fourth axis length SXb. The third axis length LXb may differ from the fourth axis length SXb. The third axis length LXb may be greater than the fourth axis length SXb. The third axis length LXb may be greater than the first axis length LXa and the second axis length SXa. In some embodiments, a ratio of the third axis length LXb to the fourth axis length SXb may be 1:1.5 to 1:15.

As described above with reference to FIG. 1, in the lower bonding pad MP1*b* and the upper bonding pad MP2*b* of the first edge regions ER1 to ER4, the third axis length LXb may be arranged in a perpendicular direction perpendicular to a radial direction from the center point O.

Figure 6:
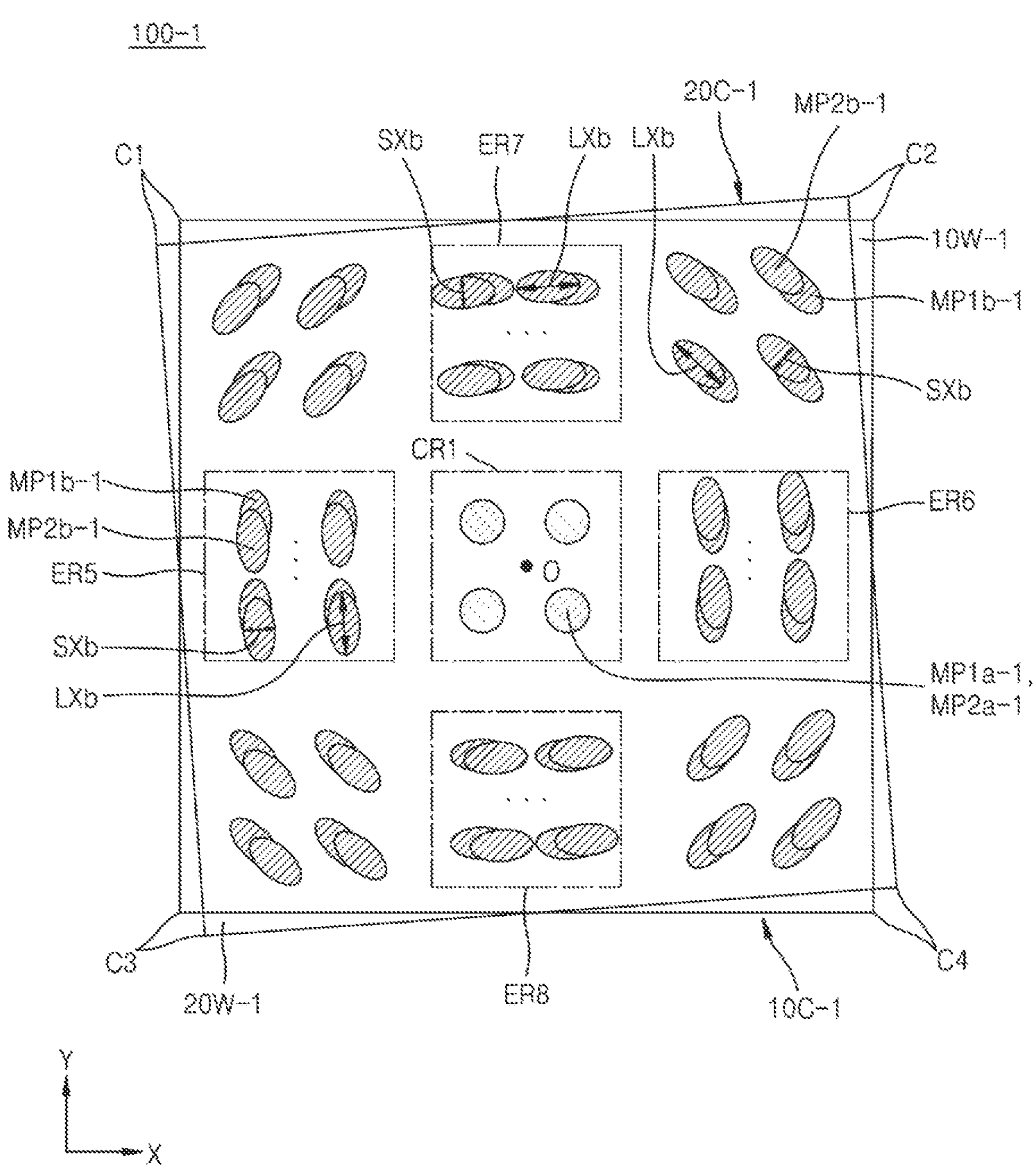
FIG. 6 is a plan view illustrating a semiconductor package according to some embodiments.

FIG. 6 is a plan view illustrating a semiconductor package 100-1 according to some embodiments.

In detail, except for that a lower bonding pad MP1*b*-1 and an upper bonding pad MP2*b*-1 are further provided in second edge regions ER5 to ER8, the semiconductor package 100-1 may be almost the same as the semiconductor package 100 of FIG. 1. In detail, in FIG. 6, the descriptions repetitive of those related to FIG. 1 will be simply given or be omitted for conciseness.

The semiconductor package 100-1 may have a structure where a lower chip 10C-1 is hybrid-bonded to an upper chip 20C-1. In the semiconductor package 100-1, the upper chip 20C-1 may be rotated counterclockwise with respect to a center point O thereof, on the lower chip 10C-1. The lower chip 10C-1 and the upper chip 20C-1 may be respectively correspond to the lower chip 10C and the upper chip 20C of FIG. 1. The lower chip 10C-1 may include a first substrate 10W-1. The upper chip 20C-1 may include a second substrate 20W-1.

The lower chip 10C-1 and the upper chip 20C-1 may include a first center region CR1 disposed near the center point O thereof. A lower bonding pad MP1*a*-1 and an upper bonding pad MP2*a*-1 each having a first shape (e.g., a circular shape) may be one-dimensionally or planarily disposed in the first center region CR1. The lower bonding pad MP1*a*-1 and the upper bonding pad MP2*a*-1 of the first center region CR1 may have the first axis length (LXa of FIG. 5) and the second axis length (SXa of FIG. 5), respectively, which may be equal to each other.

The lower chip 10C-1 and the upper chip 20C-1 may include first edge regions (ER1 to ER4 of FIG. 5) disposed near corner points C1 to C4. In the lower chip 10C-1 and the upper chip 20C-1, the second edge regions ER5 to ER8 may be arranged adjacent to edges (LFE, RIE, UPE, and LOE of FIG. 5). The second edge regions ER5 to ER8 may include a left middle edge region ER5, a right middle edge region ER6, an upper middle edge region ER7, and a lower middle edge region ER8.

A lower bonding pad MP1*b*-1 and an upper bonding pad MP2*b*-1 each having a second shape (e.g., an oval shape)

may be one-dimensionally or planarily disposed in the first edge regions (ER1 to ER4 of FIG. 5) and the second edge regions ER5 to ER8. The lower bonding pad MP1*b*-1 and the upper bonding pad MP2*b*-1 of the first edge regions (ER1 to ER4 of FIG. 5) and the second edge regions ER5 to ER8 may have the third axis length LXb and the fourth axis length SXb.

In the lower bonding pad MP1*b*-1 and the upper bonding pad MP2*b*-1 of the second edge regions ER5 to ER8, the third axis length LXb may be arranged in an X direction or a Y direction. For example, in the lower bonding pad MP1*b*-1 and the upper bonding pad MP2*b*-1 of the second edge regions ER7 and ER8, the third axis length LXb may be arranged in the X direction. In the lower bonding pad MP1*b*-1 and the upper bonding pad MP2*b*-1 of the second edge regions ER5 and ER6, the third axis length LXb may be arranged in the Y direction.

Figure 7:
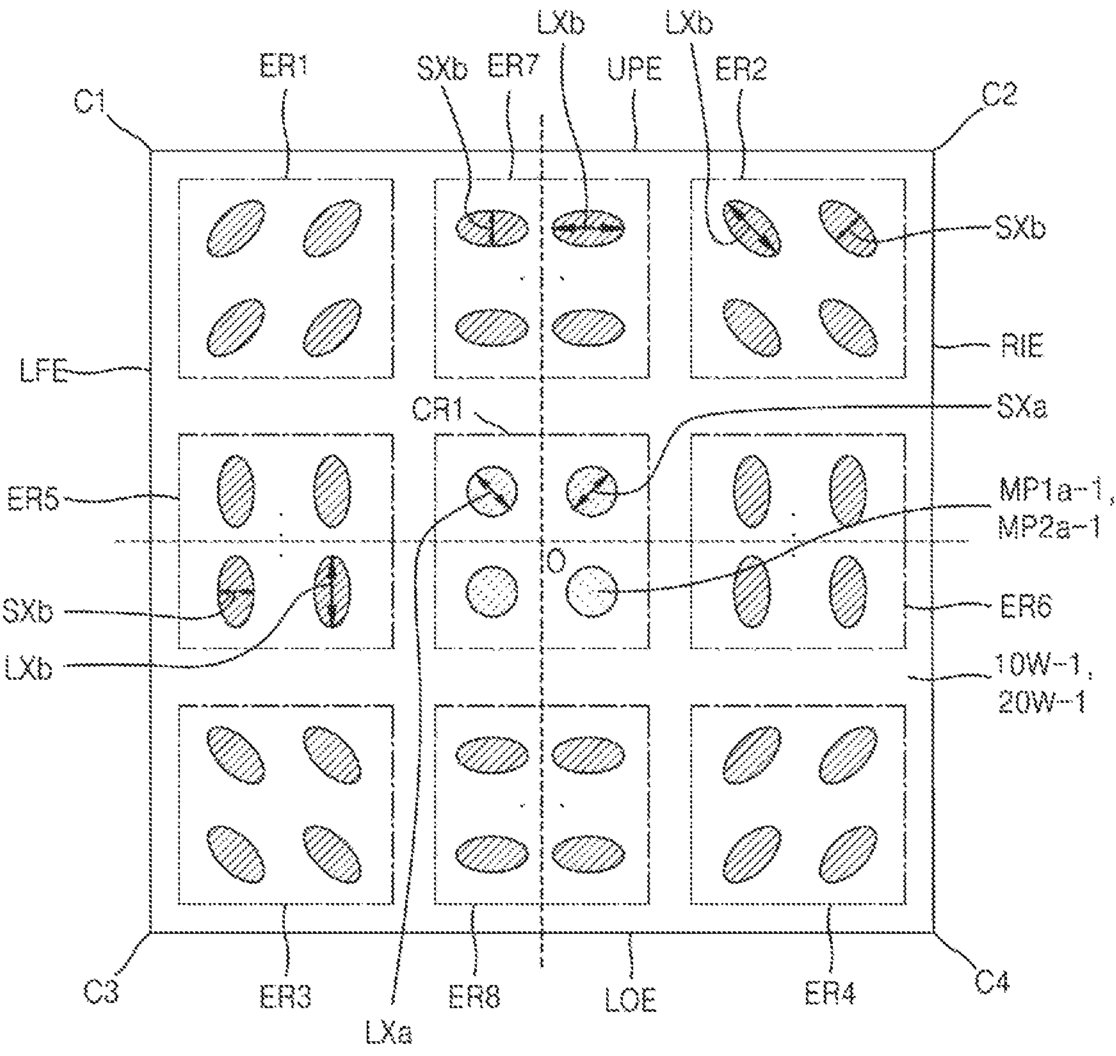
FIG. 7 is a plan view for describing a lower chip and an upper chip of the semiconductor package of FIG. 6, according to some embodiments.
Figure 7:
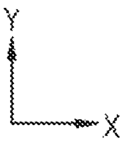

FIG. 7 is a plan view for describing a lower chip and an upper chip of the semiconductor package 100-1 of FIG. 6, according to some embodiments.

In detail, in FIG. 7, the descriptions repetitive of those related to FIGS. 5 and 6 will be simply given or be omitted for conciseness. As described above, a semiconductor package (100-1 of FIG. 6) may include a lower chip 10C-1 and an upper chip 20C-1. In FIG. 7, the lower chip 10C-1 and the upper chip 20C-1 may be the same chip. Therefore, the lower chip 10C-1 and the upper chip 20C-1 may be referred to as a second semiconductor chip CH2.

The second semiconductor chip CH2 may have a tetragonal shape. The second semiconductor chip CH2 may include substrates 10W-1 and 20W-1. The first semiconductor chip CH1 may include corner points C1 to C4 and edges LFE, RIE, UPE, and LOE. The corner points C1 to C4 may include a left upper corner point C1, a right upper corner point C2, a left lower corner point C3, and a right lower corner point C4. The edges LFE, RIE, UPE, and LOE may include a left edge LFE, a right edge RIE, an upper edge UPE, and a lower edge LOE.

In the second semiconductor chip CH2, a lower bonding pad MP1*a*-1 and an upper bonding pad MP2*a*-1 each having a first shape (e.g., a circular shape) may be one-dimensionally or planarily disposed in a first center region CR1 near a center point O thereof. The lower bonding pad MP1*a* and the upper bonding pad MP2*a* of the first center region CR1 may have the first axis length LXa and the second axis length SXa. The first axis length LXa may be the same as the second axis length SXa.

The second semiconductor chip CH2 may include first edge regions ER1 to ER4 disposed near the corner points C1 to C4. In the lower chip 10C-1 and the upper chip 20C-1, the second edge regions ER5 to ER8 may be arranged adjacent to edges LFE, RIE, UPE, and LOE.

A lower bonding pad MP1*b*-1 and an upper bonding pad MP2*b*-1 each having a second shape (e.g., an oval shape) may be one-dimensionally or planarily disposed in the first edge regions ER1 to ER4 and the second edge regions ER5 to ER8 of the second semiconductor chip CH2. The lower bonding pad MP1*b*-1 and the upper bonding pad MP2*b*-1 of the first edge regions ER1 to ER4 and the second edge regions ER5 to ER8 may have the third axis length LXb and the fourth axis length SXb.

In the lower bonding pad MP1*b*-1 and the upper bonding pad MP2*b*-1 of the second edge regions ER5 to ER8 of the second semiconductor chip CH2, the third axis length LXb may be arranged in an X direction or a Y direction. For example, in the lower bonding pad MP1*b*-1 and the upper bonding pad MP2*b*-1 of the second edge regions ER7 and ER8 of the second semiconductor chip CH2, the third axis length LXb may be arranged in the X direction.

In the lower bonding pad MP1*b*-1 and the upper bonding pad MP2*b*-1 of the second edge regions ER5 and ER6, the third axis length LXb may be arranged in the Y direction. In some embodiments, a ratio of the third axis length LXb to the fourth axis length SXb may be 1:1.5 to 1:15.

Figure 8:
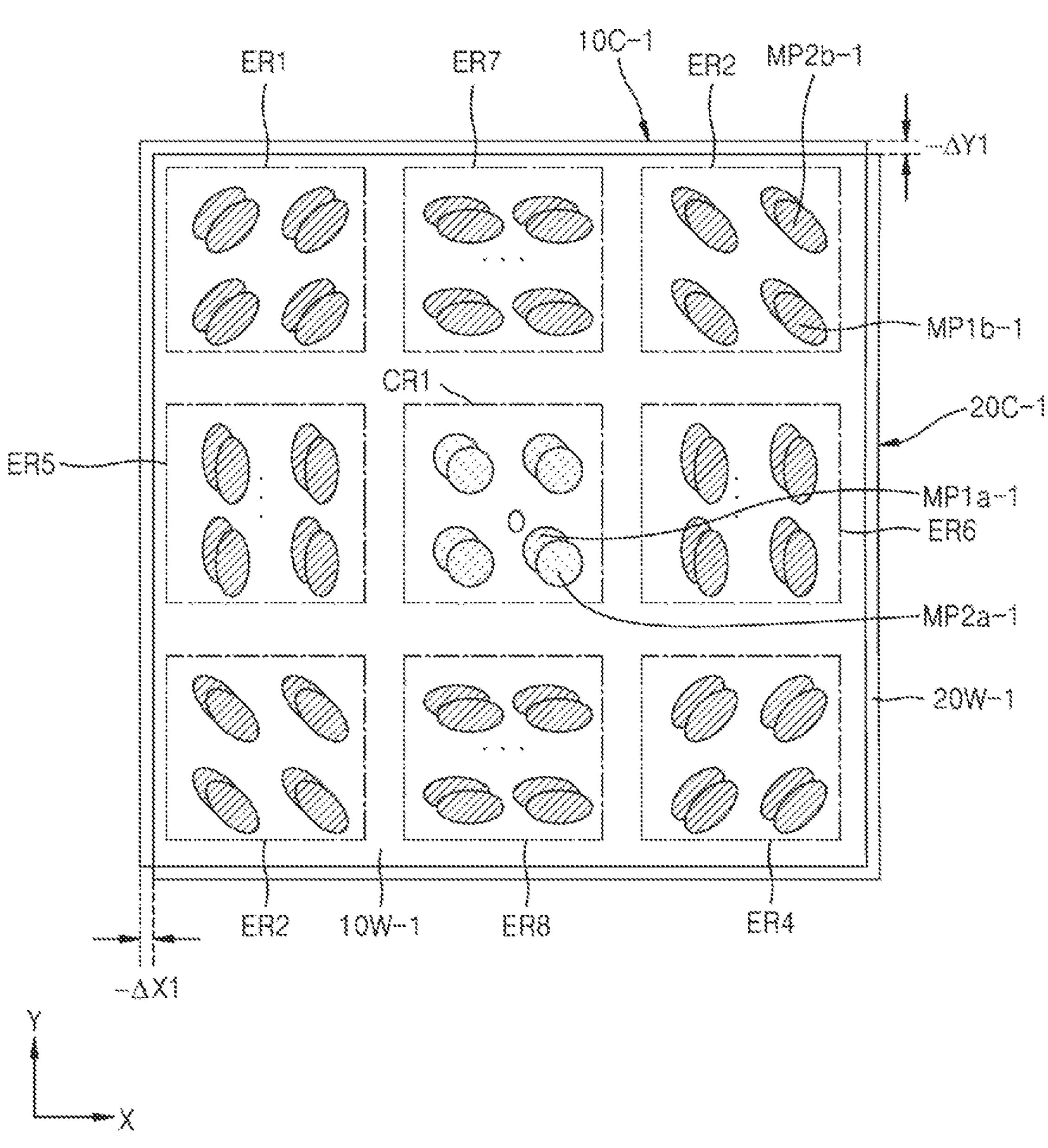
FIG. 8 is a plan view illustrating a semiconductor package according to some embodiments.

FIG. 8 is a plan view illustrating a semiconductor package 100-2 according to some embodiments.

In detail, except for that an upper chip 20C-1 is offset from and is bonded to a lower chip 10C-1 in an X direction and a −Y direction, the semiconductor package 100-2 may be almost the same as the semiconductor package 100-1 of FIG. 6. In detail, in FIG. 8, the descriptions repetitive of those related to FIG. 6 will be simply given or be omitted for conciseness.

The semiconductor package 100-2 may have a structure where the lower chip 10C-1 is hybrid-bonded to the upper chip 20C-1. In the semiconductor package 100-2, the upper chip 20C-1 may move and may be arranged in the X direction and the −Y direction with respect to a center point O thereof, on the lower chip 10C-1. In the semiconductor package 100-2, the upper chip 20C-1 may be offset by ΔX1 in the X direction and may be offset by −ΔY1 in the −Y direction, on the lower chip 10C-1, and thus, may be disposed to overlap the lower chip 10C-1.

The lower chip 10C-1 and the upper chip 20C-1 may be respectively correspond to the lower chip 10C and the upper chip 20C of FIG. 1. The lower chip 10C-1 may include a first substrate 10W-1. The upper chip 20C-1 may include a second substrate 20W-1.

The lower chip 10C-1 and the upper chip 20C-1 may include a first center region CR1 disposed near the center point O thereof. A lower bonding pad MP1*a*-1 and an upper bonding pad MP2*a*-1 each having a first shape (e.g., a circular shape) may be one-dimensionally or planarily disposed in the first center region CR1. The lower bonding pad MP1*a*-1 and the upper bonding pad MP2*a*-1 of the first center region CR1 may have the first axis length (LXa of FIG. 7) and the second axis length (SXa of FIG. 7), which may be equal to each other.

First edge regions (ER1 to ER4 of FIG. 7) and second edge regions (ER5 to ER8 of FIG. 7) may be provided in the lower chip 10C-1 and the upper chip 20C-1. A lower bonding pad MP1*b*-1 and an upper bonding pad MP2*b*-1 each having a second shape (e.g., an oval shape) may be one-dimensionally or planarily disposed in the first edge regions (ER1 to ER4 of FIG. 7) and the second edge regions (ER5 to ER8 of FIG. 7).

The lower bonding pad MP1*b*-1 and the upper bonding pad MP2*b*-1 of the first edge regions (ER1 to ER4 of FIG. 7) and the second edge regions (ER5 to ER8 of FIG. 7) may have the third axis length LXb and the fourth axis length SXb.

In the semiconductor package 100-2, when the upper chip 20C-1 is offset in the X direction and the −Y direction and is disposed on the lower chip 10C-1, the lower bonding pad MP1*a*-1 and the upper bonding pad MP2*a*-1 may overlap and may be bonded to the lower bonding pad MP1*b*-1 and the upper bonding pad MP2*b*-1, respectively.

Figure 9:
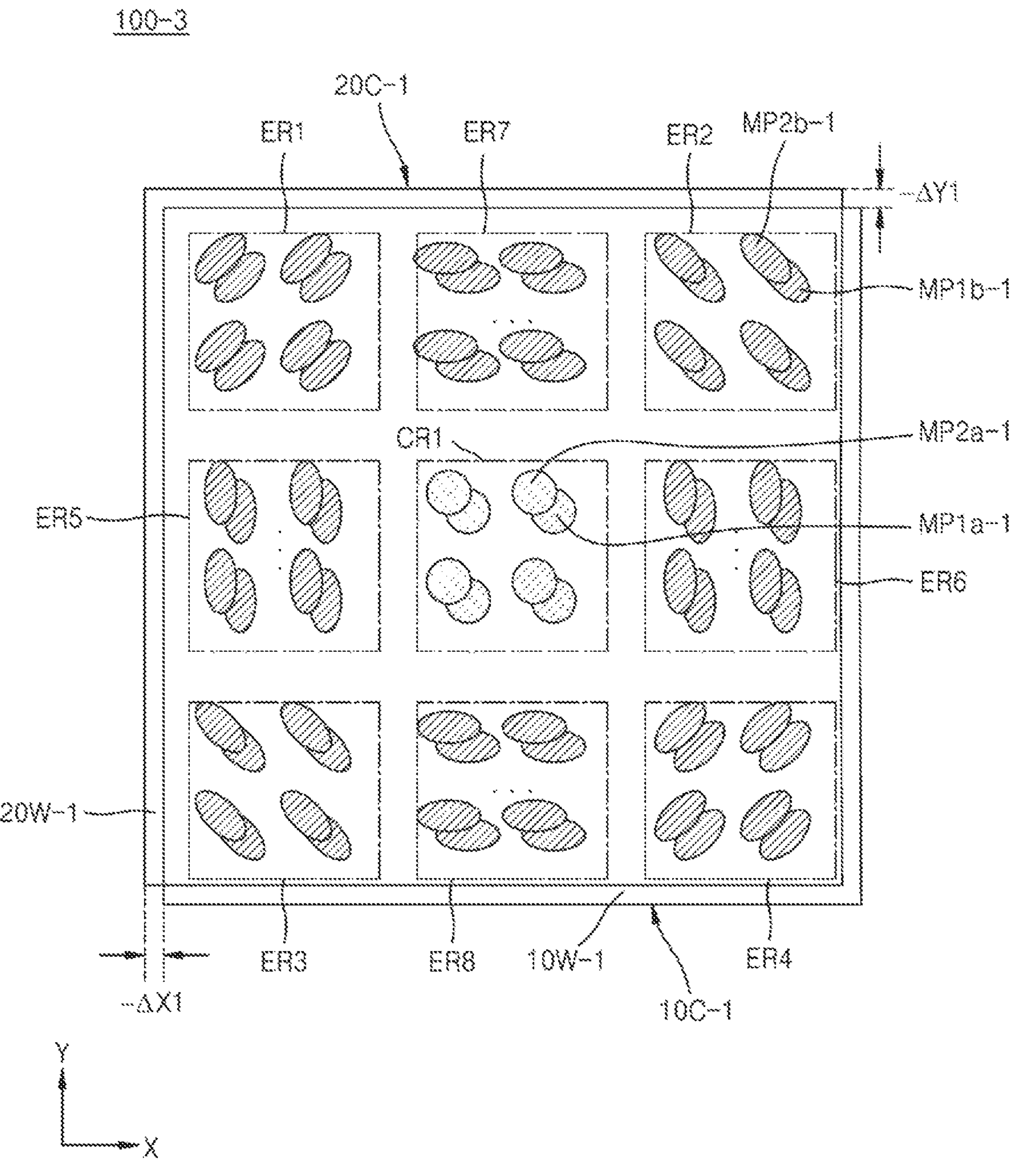
FIG. 9 is a plan view illustrating a semiconductor package according to some embodiments.

FIG. 9 is a plan view illustrating a semiconductor package 100-3 according to some embodiments.

In detail, except for that an upper chip 20C-1 is offset on and is bonded to a lower chip 10C-1 in a −X direction and a Y direction, the semiconductor package 100-3 may be almost the same as the semiconductor package 100-1 of FIG.

6. In detail, in FIG. 9, the descriptions repetitive of those related to FIG. 6 will be simply given or be omitted for conciseness.

The semiconductor package 100-3 may have a structure where the lower chip 10C-1 is hybrid-bonded to the upper chip 20C-1. In the semiconductor package 100-3, the upper chip 20C-1 may be offset and may be arranged in the −X direction and the Y direction with respect to a center point O thereof, on the lower chip 10C-1. In the semiconductor package 100-3, the upper chip 20C-1 may be offset by −ΔX1 in the −X direction and may be offset by ΔY1 in the Y direction, on the lower chip 10C-1, and thus, may be disposed to overlap the lower chip 10C-1.

The lower chip 10C-1 and the upper chip 20C-1 may be respectively correspond to the lower chip 10C and the upper chip 20C of FIG. 1. The lower chip 10C-1 may include a first substrate 10W-1. The upper chip 20C-1 may include a second substrate 20W-1.

The lower chip 10C-1 and the upper chip 20C-1 may include a first center region CR1 disposed near the center point O thereof. A lower bonding pad MP1*a*-1 and an upper bonding pad MP2*a*-1 each having a first shape (e.g., a circular shape) may be one-dimensionally or planarily disposed in the first center region CR1. The lower bonding pad MP1*a*-1 and the upper bonding pad MP2*a*-1 of the first center region CR1 may have the first axis length (LXa of FIG. 7) and the second axis length (SXa of FIG. 7), which may be equal to each other.

First edge regions (ER1 to ER4 of FIG. 7) and second edge regions (ER5 to ER8 of FIG. 7) may be provided in the lower chip 10C-1 and the upper chip 20C-1. A lower bonding pad MP1*b*-1 and an upper bonding pad MP2*b*-1 each having a second shape (e.g., an oval shape) may be one-dimensionally or planarily disposed in the first edge regions (ER1 to ER4 of FIG. 7) and the second edge regions (ER5 to ER8 of FIG. 7).

The lower bonding pad MP1*b*-1 and the upper bonding pad MP2*b*-1 of the first edge regions (ER1 to ER4 of FIG. 7) and the second edge regions (ER5 to ER8 of FIG. 7) may have the third axis length LXb and the fourth axis length SXb.

In the semiconductor package 100-3, when the upper chip 20C-1 is offset in the −X direction and the Y direction and is disposed on the lower chip 10C-1, the lower bonding pad MP1*a*-1 and the upper bonding pad MP2*a*-1 may overlap and may be bonded to the lower bonding pad MP1*b*-1 and the upper bonding pad MP2*b*-1, respectively.

Figure 10:
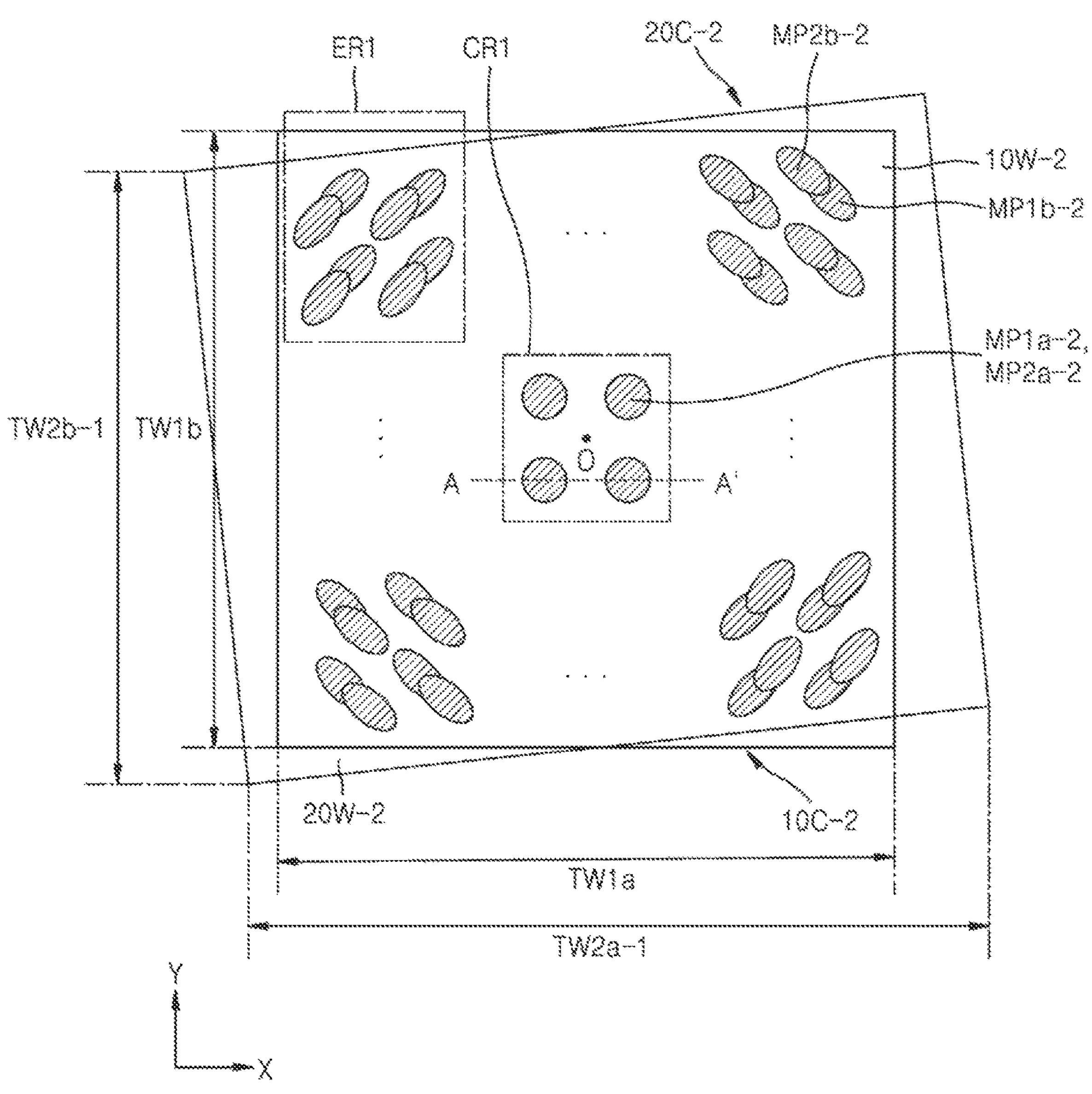
FIG. 10 is a plan view illustrating a semiconductor package according to some embodiments.

FIG. 10 is a plan view illustrating a semiconductor package 100-4 according to some embodiments.

In detail, except for that an upper chip 20C-2 has a size which is greater than that of a lower chip 10C-2, the semiconductor package 100-4 may be almost the same as the semiconductor package 100 of FIG. 1. In detail, in FIG. 10, the descriptions repetitive of those related to FIG. 1 will be simply given or be omitted for conciseness.

The semiconductor package 100-4 may have a structure where the lower chip 10C-2 is hybrid-bonded to the upper chip 20C-2. The lower chip 10C-2 may include a first substrate 10W-2. The upper chip 20C-2 may include a second substrate 20W-2. The lower chip 10C-2 and the upper chip 20C-2 may be respectively correspond to the lower chip 10C and the upper chip 20C of FIG. 1.

The lower chip 10C-2 may have a first length TW1*a* in an X direction and a second length TW1*b* in a Y direction. The upper chip 20C-2 may have a third length TW2*a*-1 in the X direction and a fourth length TW2*b*-1 in the Y direction. The third length TW2*a*-1 may be greater than the first length TW1*a*. The fourth length TW2*b*-1 may be greater than the second length TW1*b*. The first length TW1*a*, the second length TW1*b*, the third length TW2*a*-1, and the fourth length TW2*b*-1 may be variously changed based on a package structure.

The lower chip 10C-2 and the upper chip 20C-2 may include a first center region CR1 disposed near a center point O thereof. A lower bonding pad MP1*a*-2 and an upper bonding pad MP2*a*-2 each having a first shape (e.g., a circular shape) may be one-dimensionally or planarily disposed in the first center region CR1. The lower bonding pad MP1*a*-2 and the upper bonding pad MP2*a*-2 of the first center region CR1 may have the first axis length (LXa of FIG. 5) and the second axis length (SXa of FIG. 5), which may be equal to each other.

The lower chip 10C-2 and the upper chip 20C-2 may be disposed in the first edge region ER1. A lower bonding pad MP1*b*-2 and an upper bonding pad MP2*b*-2 each having a second shape (e.g., an oval shape) may be one-dimensionally or planarily disposed in the first edge region ER1. The lower bonding pad MP1*a*-2 and the upper bonding pad MP2*a*-2 of the first edge region ER1 may have the third axis length (LXb of FIG. 5) and the fourth axis length (SXb of FIG. 5).

In the lower bonding pad MP1*b*-2 and the upper bonding pad MP2*b*-2 of the first edge region ER1 of the lower chip 10C-2 and the upper chip 20C-2, the third axis length (LXb of FIG. 5) of an oval shape may be arranged in a perpendicular direction (a V direction of FIG. 1) perpendicular to a radial direction (a D direction of FIG. 1) from the center point O.

In the semiconductor package 100-4, when the upper chip 20C-2 has a size which is greater than that of the lower chip 10C-2, the lower bonding pad MP1*a*-2 and the upper bonding pad MP2*a*-2 may overlap and may be bonded to the lower bonding pad MP1*b*-2 and the upper bonding pad MP2*b*-2, respectively.

Figure 11:
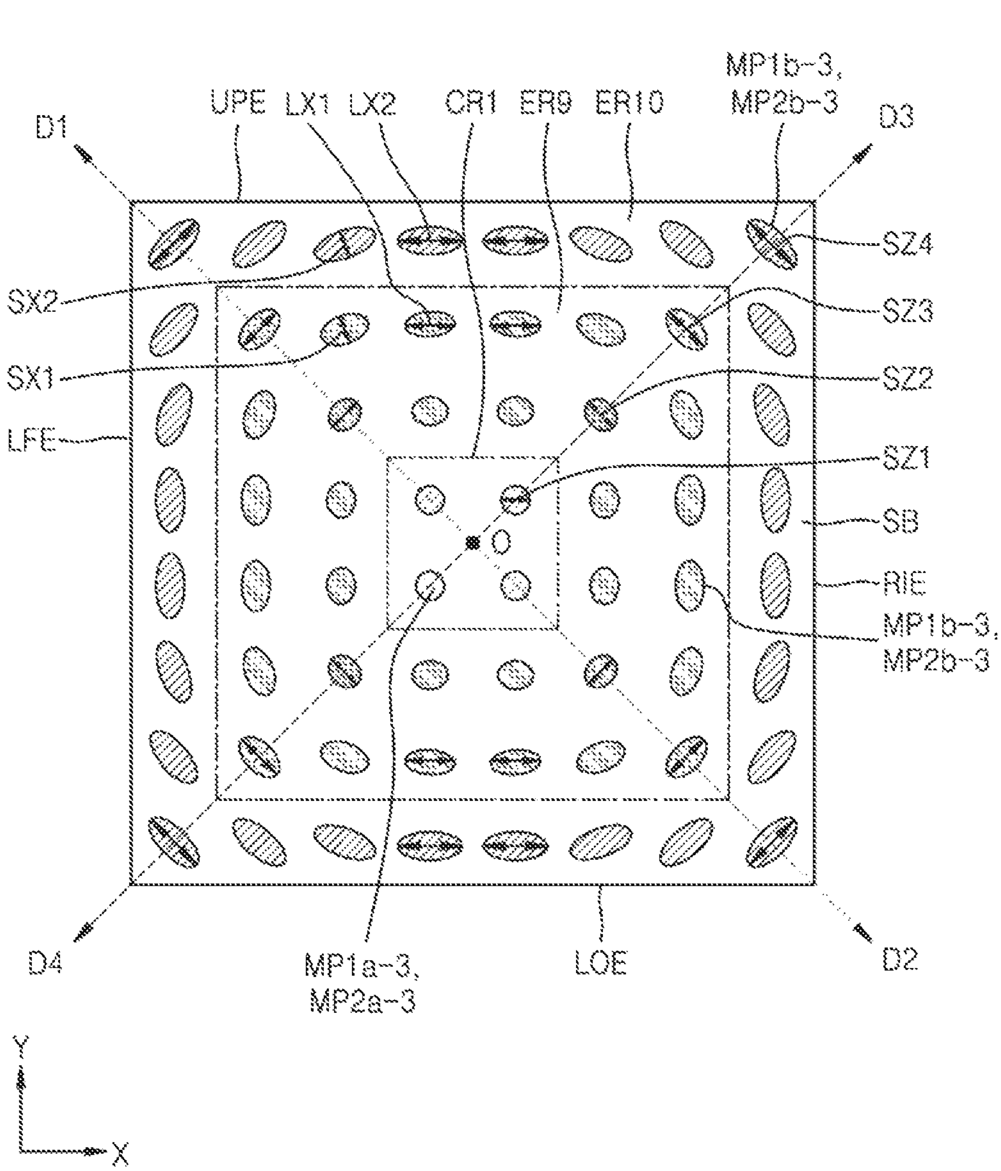
FIG. 11 is a plan view for describing an example of a semiconductor chip usable in a semiconductor package according to some embodiments.

FIG. 11 is a plan view for describing an example of a semiconductor chip CH3 usable in a semiconductor package according to some embodiments.

In detail, the semiconductor chip CH3 of FIG. 11 may be referred to as a third semiconductor chip CH3, so as to be differentiated from the first semiconductor chip CH1 and the second semiconductor chip CH2. Except for that the third semiconductor chip CH3 includes third and fourth edge regions ER9 and ER10, the third semiconductor chip CH3 may be almost the same as the first semiconductor chip CH1 of FIG. 5 and the second semiconductor chip CH2 of FIG. 7.

Furthermore, except for that the arrangement or sizes of a lower bonding pad MP1*b*-3 and an upper bonding pad MP2*b*-3 of the third and fourth edge regions ER9 and ER10 differ, the third semiconductor chip CH3 may be almost the same as the first semiconductor chip CH1 of FIG. 5 and the second semiconductor chip CH2 of FIG. 7.

In detail, in FIG. 11, the descriptions repetitive of those related to FIGS. 5 and 7 will be simply given or be omitted for conciseness. In FIG. 11, a D1 direction, a D2 direction, a D3 direction, and a D4 direction may represent radial directions with respect to a center point O of the third semiconductor chip CH3.

The third semiconductor chip CH3 may correspond to the lower chips 10C, 10C-1, and 10C-2 and the upper chips 20C, 20C-1, and 20C-2 described above. The third semiconductor chip CH3 may have a tetragonal shape. The third semiconductor chip CH3 may include a substrate SB. The substrate SB may correspond to the first substrates 10W, 10W-1, and 10W-2 and the second substrates 20W, 20W-1, and 20W-2 described above. The third semiconductor chip CH3 may include edges LFE, RIE, UPE, and LOE. The edges LFE, RIE, UPE, and LOE may include a left edge LFE, a right edge RIE, an upper edge UPE, and a lower edge LOE.

In the third semiconductor chip CH3, a lower bonding pad MP1*a*-3 and an upper bonding pad MP2*a*-3 each having a first shape (e.g., a circular shape) may be one-dimensionally or planarily disposed in a first center region CR1 near a center point O thereof. The lower bonding pad MP1*a*-3 and the upper bonding pad MP2*a*-3 of the first center region CR1 may have a first length SZ1. The first length SZ1 may correspond to the first axis length LXa and the second axis length SXa of FIGS. 5 and 7.

The third semiconductor chip CH3 may include a third edge region ER9 and a fourth edge region ER10 which are sequentially provided at a perimeter of the first center region CR1. A lower bonding pad MP1*b*-3 and an upper bonding pad MP2*b*-3 each having a second shape (e.g., an oval shape) may be one-dimensionally or planarily disposed in the third edge region ER9.

The lower bonding pad MP1*b*-3 and the upper bonding pad MP2*b*-3 of the third edge region ER9 may include the third axis length LX1 and the fourth axis length SX1. The third axis length LX1 and the fourth axis length SX1 may respectively correspond to the third axis length LXb and the fourth axis length SXb of FIGS. 5 and 7. The third axis length LX1 may be greater than the fourth axis length SX1.

The third axis length LX1 may be greater than the first length SZ1. The lower bonding pad MP1*b*-3 and the upper bonding pad MP2*b*-3 of the third edge region ER9 may include a second length SZ2 and a third length SZ3. The second length SZ2 may be greater than the first length SZ1. The third length SZ3 may be greater than the second length SZ2.

The fourth edge region ER10 may be a region adjacent to edges LFE, RIE, UPE, and LOE. The fourth edge region ER10 may include some of the first edge regions ER1 to ER4 or the second edge regions ER5 to ER8 described above with reference to FIGS. 5 and 7. A lower bonding pad MP1*b*-3 and an upper bonding pad MP2*b*-3 each having a second shape (e.g., an oval shape) may be one-dimensionally or planarily disposed in the fourth edge region ER10.

The lower bonding pad MP1*b*-3 and the upper bonding pad MP2*b*-3 of the fourth edge region ER10 may include a fifth axis length LX2 and a sixth axis length SX2. The fifth axis length LX2 and the sixth axis length SX2 may respectively correspond to the third axis length LXb and the fourth axis length SXb of FIGS. 5 and 7. The fifth axis length LX2 may be greater than the sixth axis length SX2.

The third axis length LX1 may be greater than the first length SZ1. The lower bonding pad MP1*b*-3 and the upper bonding pad MP2*b*-3 of the fourth edge region ER10 may have a fourth length SZ4. The fourth length SZ4 may be greater than the third length SZ3.

As described above, in the third semiconductor chip CH3, the lower bonding pads MP1*a*-3 and MP1*b*-3 and the upper bonding pads MP2*a*-3 and MP2*b*-3 may be arranged to increase progressively in size in a radial direction (a D1 direction, a D2 direction, a D3 direction, and a D4 direction) with respect to the center point O.

Figure 12:
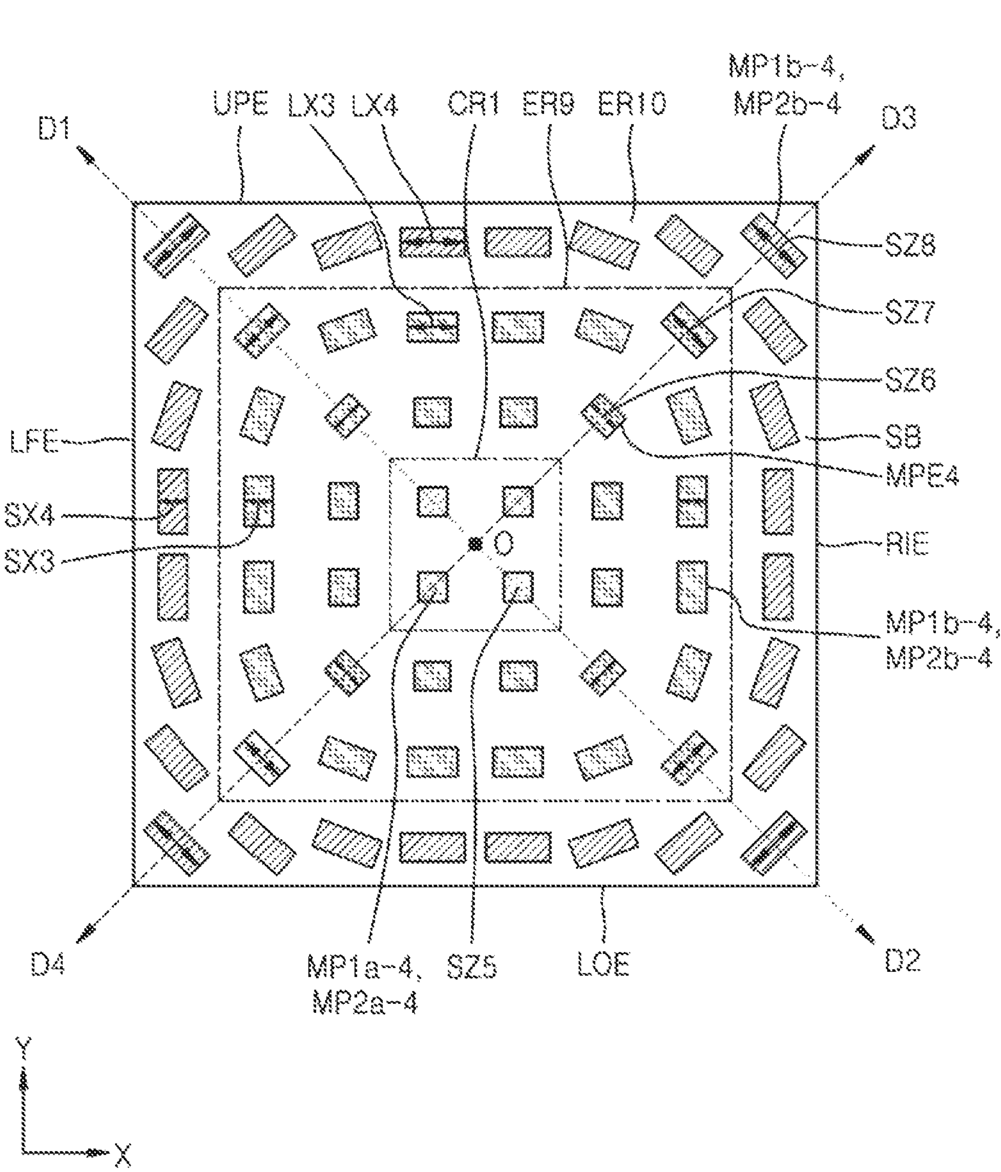
FIG. 12 is a plan view for describing an example of a semiconductor chip usable in a semiconductor package according to some embodiments.

FIG. 12 is a plan view for describing some embodiments of a semiconductor chip CH4 usable in a semiconductor package according to some embodiments.

In detail, the semiconductor chip CH4 of FIG. 12 may be referred to as a fourth semiconductor chip CH4, so as to be differentiated from the semiconductor chips CH1 to CH3 described above. Except for that lower bonding pads MP1*a*-4 and MP1*b*-4 and upper bonding pads MP2*a*-4 and MP2*b*-4 are differently modified in shape, the fourth semiconductor chip CH4 may be almost the same as the third semiconductor chip CH3 of FIG. 11.

Except for that the fourth semiconductor chip CH4 includes third and fourth edge regions ER9 and ER10, the fourth semiconductor chip CH4 may be almost the same as the first semiconductor chip CH1 of FIG. 5 and the second semiconductor chip CH2 of FIG. 7. Furthermore, except for that the arrangements or sizes of lower bonding pads MP1*a*-4 and MP1*b*-4 and upper bonding pads MP2*a*-4 and MP2*b*-4 of the third and fourth edge regions ER9 and ER10 differ, the fourth semiconductor chip CH4 may be almost the same as the first semiconductor chip CH1 of FIG. 5 and the second semiconductor chip CH2 of FIG. 7.

In detail, in FIG. 12, the descriptions repetitive of those related to FIGS. 5, 7, and 11 will be simply given or be omitted for conciseness. In FIG. 12, a D1 direction, a D2 direction, a D3 direction, and a D4 direction may represent radial directions with respect to a center point O of the fourth semiconductor chip CH4.

The fourth semiconductor chip CH4 may correspond to the lower chips 10C, 10C-1, and 10C-2 and the upper chips 20C, 20C-1, and 20C-2 described above. The fourth semiconductor chip CH4 may have a tetragonal shape. The fourth semiconductor chip CH4 may include a substrate SB. The substrate SB may correspond to the first substrates 10W, 10W-1, and 10W-2 and the second substrates 20W, 20W-1, and 20W-2 described above. The fourth semiconductor chip CH4 may include edges LFE, RIE, UPE, and LOE.

In the fourth semiconductor chip CH4, a lower bonding pad MP1*a*-4 and an upper bonding pad MP2*a*-4 each having a first shape (e.g., a tetragonal shape) may be one-dimensionally or planarily disposed in a first center region CR1 near a center point O thereof. The lower bonding pad MP1*a*-4 and the upper bonding pad MP2*a*-4 of the first center region CR1 may have a first length SZ5. The first length SZ5 may correspond to the first axis length LXa and the second axis length SXa of FIGS. 5 and 7.

The fourth semiconductor chip CH4 may include a third edge region ER9 and a fourth edge region ER10 which are sequentially provided at a perimeter of the first center region CR1. A lower bonding pad MP1*b*-4 and an upper bonding pad MP2*b*-4 each having a second shape (e.g., a tetragonal shape) may be one-dimensionally or planarily disposed in the third edge region ER9.

The lower bonding pad MP1*b*-4 and the upper bonding pad MP2*b*-4 of the third edge region ER9 may include a seventh axis length LX3 and a eighth axis length SX3. The seventh axis length LX3 and the eighth axis length SX3 may respectively correspond to the third axis length LXb and the fourth axis length SXb of FIGS. 5 and 7.

The seventh axis length LX3 may be greater than the eighth axis length SX3. The seventh axis length LX3 may be greater than the first length SZ5. The lower bonding pad MP1*b*-4 and the upper bonding pad MP2*b*-4 of the third edge region ER9 may include a second length SZ6 and a third length SZ7. The second length SZ6 may be greater than the first length SZ5. The third length SZ7 may be greater than the second length SZ6.

The fourth edge region ER10 may be a region adjacent to edges LFE, RIE, UPE, and LOE. The fourth edge region ER10 may include some of the first edge regions ER1 to ER4 or the second edge regions ER5 to ER8 described above with reference to FIGS. 5 and 7. A lower bonding pad MP1*b*-4 and an upper bonding pad MP2*b*-4 each having a second shape (e.g., a tetragonal shape) may be one-dimensionally or planarily disposed in the fourth edge region ER10.

The lower bonding pad MP1*b*-4 and the upper bonding pad MP2*b*-4 of the fourth edge region ER10 may include the seventh axis length LX3 and the eighth axis length SX3. The seventh axis length LX3 and the eighth axis length SX3 may respectively correspond to the third axis length LXb and the fourth axis length SXb of FIGS. 5 and 7. The seventh axis length LX3 may be greater than the eighth axis length SX3. The seventh axis length LX3 may be greater than the first length SZ5. The lower bonding pad MP1*b*-4 and the upper bonding pad MP2*b*-4 of the fourth edge region ER10 may have a fourth length SZ8. The fourth length SZ8 may be greater than the third length SZ7.

As described above, in the fourth semiconductor chip CH4, the lower bonding pad MP1*b*-4 and the upper bonding pad MP2*b*-4 may be configured in a second shape (e.g., a tetragonal shape). In the fourth semiconductor chip CH4, the lower bonding pads MP1*a*-4 and MP1*b*-4 and the upper bonding pads MP2*a*-4 and MP2*b*-4 may be arranged to increase progressively in size in a radial direction (a D1 direction, a D2 direction, a D3 direction, and a D4 direction) with respect to the center point O.

Figure 13:
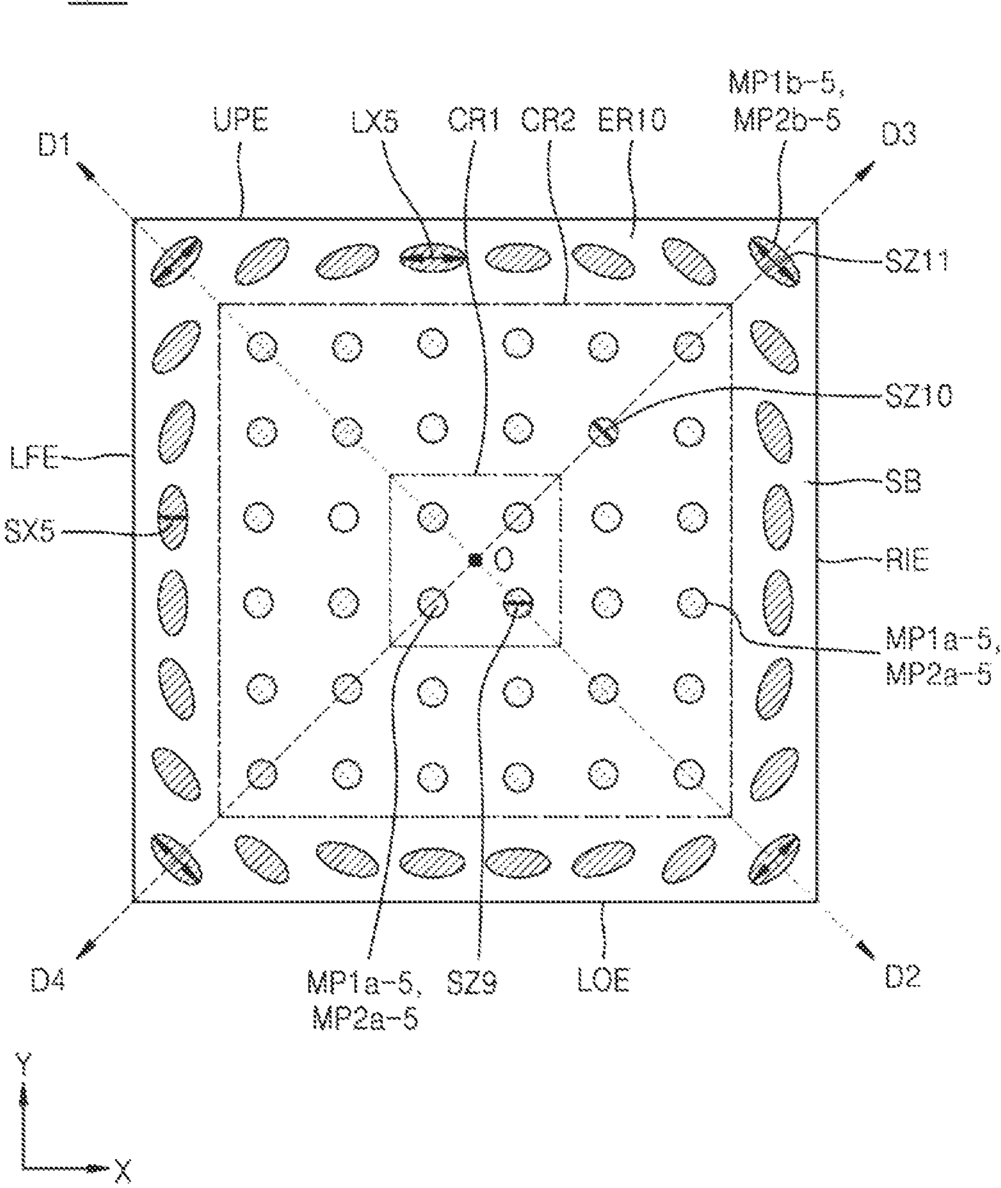
FIG. 13 is a plan view for describing an example of a semiconductor chip usable in a semiconductor package according to some embodiments.

FIG. 13 is a plan view for describing some embodiments of a semiconductor chip CH5 usable in a semiconductor package according to some embodiments.

In detail, the semiconductor chip CH5 of FIG. 13 may be referred to as a fifth semiconductor chip CH5, so as to be differentiated from the semiconductor chips CH1 to CH4 described above. Except for that a second center region CR2 is formed at a perimeter of a first center region CR1, the fifth semiconductor chip CH5 may be almost the same as the third semiconductor chip CH3 of FIG. 11.

Except for that the fifth semiconductor chip CH5 includes a second center region CR2 and a fourth edge region ER10, the fifth semiconductor chip CH5 may be almost the same as the first semiconductor chip CH1 of FIG. 5 and the second semiconductor chip CH2 of FIG. 7. Furthermore, except for that the arrangements of a lower bonding pad MP1*b*-5 and an upper bonding pad MP2*b*-5 of the fourth edge region ER10 differ, the fifth semiconductor chip CH5 may be almost the same as the first semiconductor chip CH1 of FIG. 5 and the second semiconductor chip CH2 of FIG. 7.

In FIG. 13, the descriptions repetitive of those related to FIGS. 5, 7, and 11 will be simply given or be omitted for conciseness. In FIG. 13, a D1 direction, a D2 direction, a D3 direction, and a D4 direction may represent radial directions with respect to a center point O of the fifth semiconductor chip CH5.

The fifth semiconductor chip CH5 may correspond to the lower chips 10C, 10C-1, and 10C-2 and the upper chips 20C, 20C-1, and 20C-2 described above. The fifth semiconductor chip CH5 may have a tetragonal shape. The fifth semiconductor chip CH5 may include a substrate SB. The substrate SB may correspond to the first substrates 10W, 10W-1, and 10W-2 and the second substrates 20W, 20W-1, and 20W-2 described above. The fifth semiconductor chip CH5 may include edges LFE, RIE, UPE, and LOE.

In the fifth semiconductor chip CH5, a lower bonding pad MP1*a*-5 and an upper bonding pad MP2*a*-5 each having a first shape (e.g., a circular shape) may be one-dimensionally or planarily disposed in a first center region CR1 near the center point O thereof. The lower bonding pad MP1*a*-5 and the upper bonding pad MP2*a*-5 of the first center region CR1 may have a first length SZ9. The first length SZ9 may correspond to the first axis length LXa and the second axis length SXa of FIGS. 5 and 7.

The fifth semiconductor chip CH5 may include the second center region CR2 and the fourth edge region ER10 which are sequentially provided at a perimeter of the first center region CR1. A lower bonding pad MP1*a*-5 and an upper bonding pad MP2*a*-5 each having a first shape (e.g., a circular shape) may be one-dimensionally or planarily disposed in the second center region CR2.

The lower bonding pad MP1*a*-5 and the upper bonding pad MP2*a*-5 of the second center region CR2 may have a second length SZ10. The second length SZ10 may correspond to the first axis length LXa and the second axis length SXa of FIGS. 5 and 7. The second length SZ10 may be greater than the first length SZ9.

The fourth edge region ER10 may be a region adjacent to edges LFE, RIE, UPE, and LOE. The fourth edge region ER10 may include some of the first edge regions ER1 to ER4 or the second edge regions ER5 to ER8 described above with reference to FIGS. 5 and 7. A lower bonding pad MP1*b*-5 and an upper bonding pad MP2*b*-5 each having a second shape (e.g., an oval shape) may be one-dimensionally or planarily disposed in the fourth edge region ER10.

The lower bonding pad MP1*b*-5 and the upper bonding pad MP2*b*-5 of the fourth edge region ER10 may have a third length SZ11. The lower bonding pad MP1*b*-5 and the upper bonding pad MP2*b*-5 of the fourth edge region ER10 may include a ninth axis length LX5 and a tenth axis length SX5. The ninth axis length LX5 and the tenth axis length SX5 may respectively correspond to the third axis length LXb and the fourth axis length SXb of FIGS. 5 and 7. The third length SZ11 may be greater than the first length SZ9 and the second length SZ10.

As described above, in the fifth semiconductor chip CH5, the lower bonding pad MP1*b*-5 and the upper bonding pad MP2*b*-5 of the fourth edge region ER10 may be configured in a second shape (i.e., an oval shape), and thus, an upper chip may be easily bonded to a lower chip.

Figure 14:
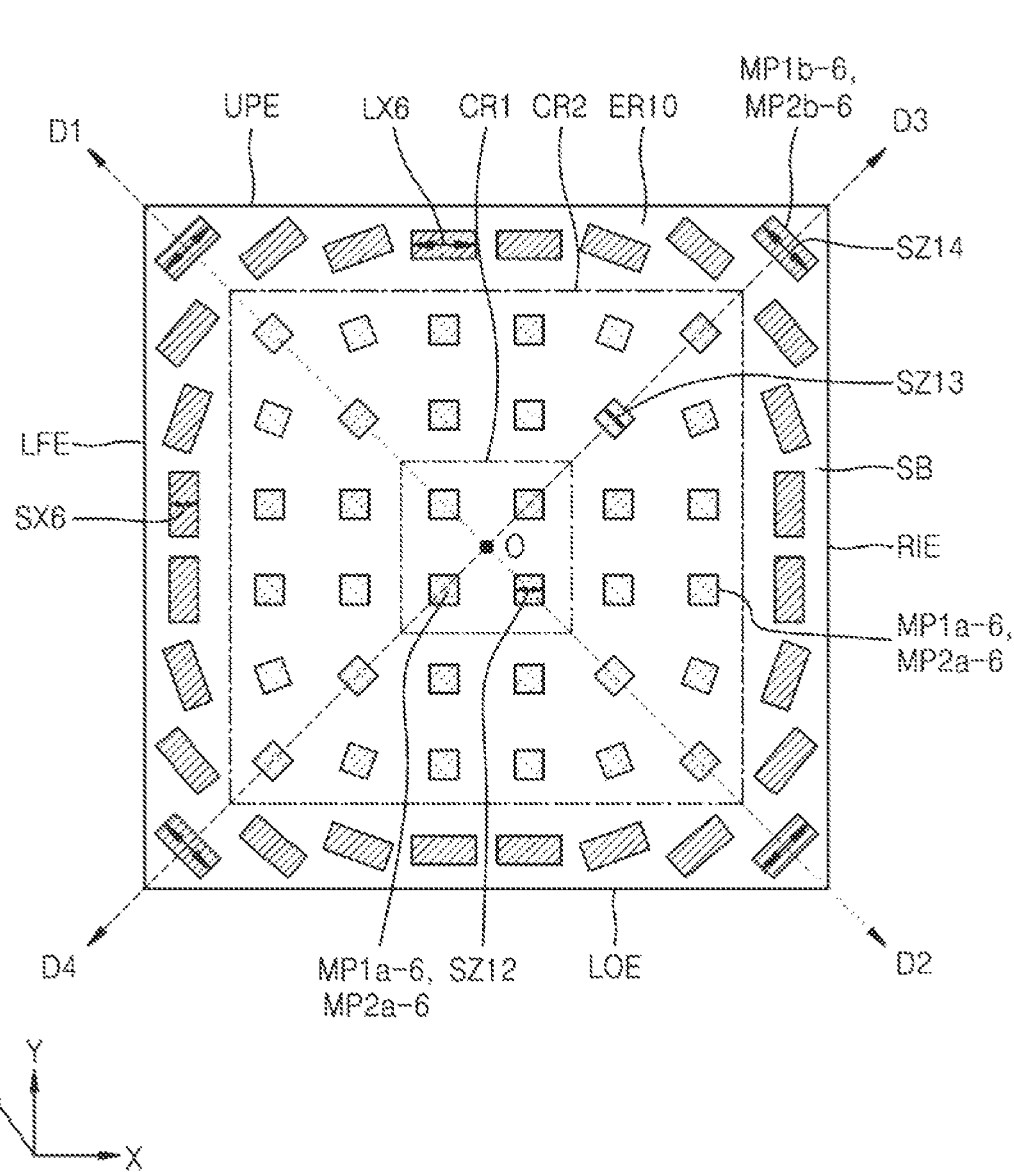
FIG. 14 is a plan view for describing an example of a semiconductor chip usable in a semiconductor package according to some embodiments.

FIG. 14 is a plan view for describing some embodiments of a semiconductor chip CH6 usable in a semiconductor package according to some embodiments.

In detail, the semiconductor chip CH6 of FIG. 14 may be referred to as a sixth semiconductor chip CH6, so as to be differentiated from the semiconductor chips CH1 to CH5 described above. Except for that lower bonding pads MP1*a*-6 and MP1*b*-6 and upper bonding pads MP2*a*-6 and MP2*b*-6 are differently modified in shape, the sixth semiconductor chip CH6 may be almost the same as the fifth semiconductor chip CH5 of FIG. 13.

Except for that the sixth semiconductor chip CH6 includes a second center region CR2 and a fourth edge region ER10, the sixth semiconductor chip CH6 may be almost the same as the first semiconductor chip CH1 of FIG. 5 and the second semiconductor chip CH2 of FIG. 7. Furthermore, except for that the arrangements of a lower bonding pad MP1*b*-6 and an upper bonding pad MP2*b*-6 of the fourth edge region ER10 differ, the sixth semiconductor chip CH6 may be almost the same as the first semiconductor chip CH1 of FIG. 5 and the second semiconductor chip CH2 of FIG. 7.

In FIG. 14, the descriptions repetitive of those related to FIGS. 5, 7, and 13 will be simply given or be omitted for conciseness. In FIG. 14, a D1 direction, a D2 direction, a D3 direction, and a D4 direction may represent radial directions with respect to a center point O of the sixth semiconductor chip CH6.

The sixth semiconductor chip CH6 may correspond to the lower chips 10C, 10C-1, and 10C-2 and the upper chips 20C, 20C-1, and 20C-2 described above. The sixth semiconductor chip CH6 may have a tetragonal shape. The sixth semiconductor chip CH6 may include a substrate SB. The substrate SB may correspond to the first substrates 10W, 10W-1, and 10W-2 and the second substrates 20W, 20W-1, and 20W-2 described above. The sixth semiconductor chip CH6 may include edges LFE, RIE, UPE, and LOE.

In the sixth semiconductor chip CH6, a lower bonding pad MP1*a*-6 and an upper bonding pad MP2*a*-6 each having a first shape (i.e., a tetragonal (or square) shape) may be one-dimensionally or planarily disposed in the first center region CR1 near the center point O thereof. The lower bonding pad MP1*a*-6 and the upper bonding pad MP2*a*-6 of the first center region CR1 may have a first length SZ12. The first length SZ12 may correspond to the first axis length LXa and the second axis length SXa of FIGS. 5 and 7.

The sixth semiconductor chip CH6 may include a second center region CR2 and a fourth edge region ER10 which are sequentially provided at a perimeter of the first center region CR1. A lower bonding pad MP1*a*-6 and an upper bonding pad MP2*a*-6 each having a first shape (i.e., a tetragonal (or square) shape) may be one-dimensionally or planarily disposed in the second center region CR2.

The lower bonding pad MP1*a*-6 and the upper bonding pad MP2*a*-6 of the second center region CR2 may have a second length SZ13. The second length SZ13 may correspond to the first axis length LXa and the second axis length SXa of FIGS. 5 and 7. The second length SZ13 may be greater than the first length SZ12.

The fourth edge region ER10 may be a region adjacent to edges LFE, RIE, UPE, and LOE. The fourth edge region ER10 may include some of the first edge regions ER1 to ER4 or the second edge regions ER5 to ER8 described above with reference to FIGS. 5 and 7. A lower bonding pad MP1*b*-6 and an upper bonding pad MP2*b*-6 each having a second shape (i.e., a rectangular shape) may be one-dimensionally or planarily disposed in the fourth edge region ER10.

The lower bonding pad MP1*b*-6 and the upper bonding pad MP2*b*-6 of the fourth edge region ER10 may have a third length SZ14. A eleventh axis length LX6 and a twelfth axis length SX6 of the lower bonding pad MP1*b*-6 and the upper bonding pad MP2*b*-6 may respectively correspond to the first axis length LXa and the second axis length SXa of FIGS. 5 and 7. The third length SZ14 may be greater than the first length SZ12 and the second length SZ13.

As described above, in the sixth semiconductor chip CH6, the lower bonding pad MP1*b*-6 and the upper bonding pad MP2*b*-6 of the fourth edge region ER10 may be configured in a second shape (i.e., a rectangular shape), and thus, an upper chip may be easily bonded to a lower chip.

Figure 15:
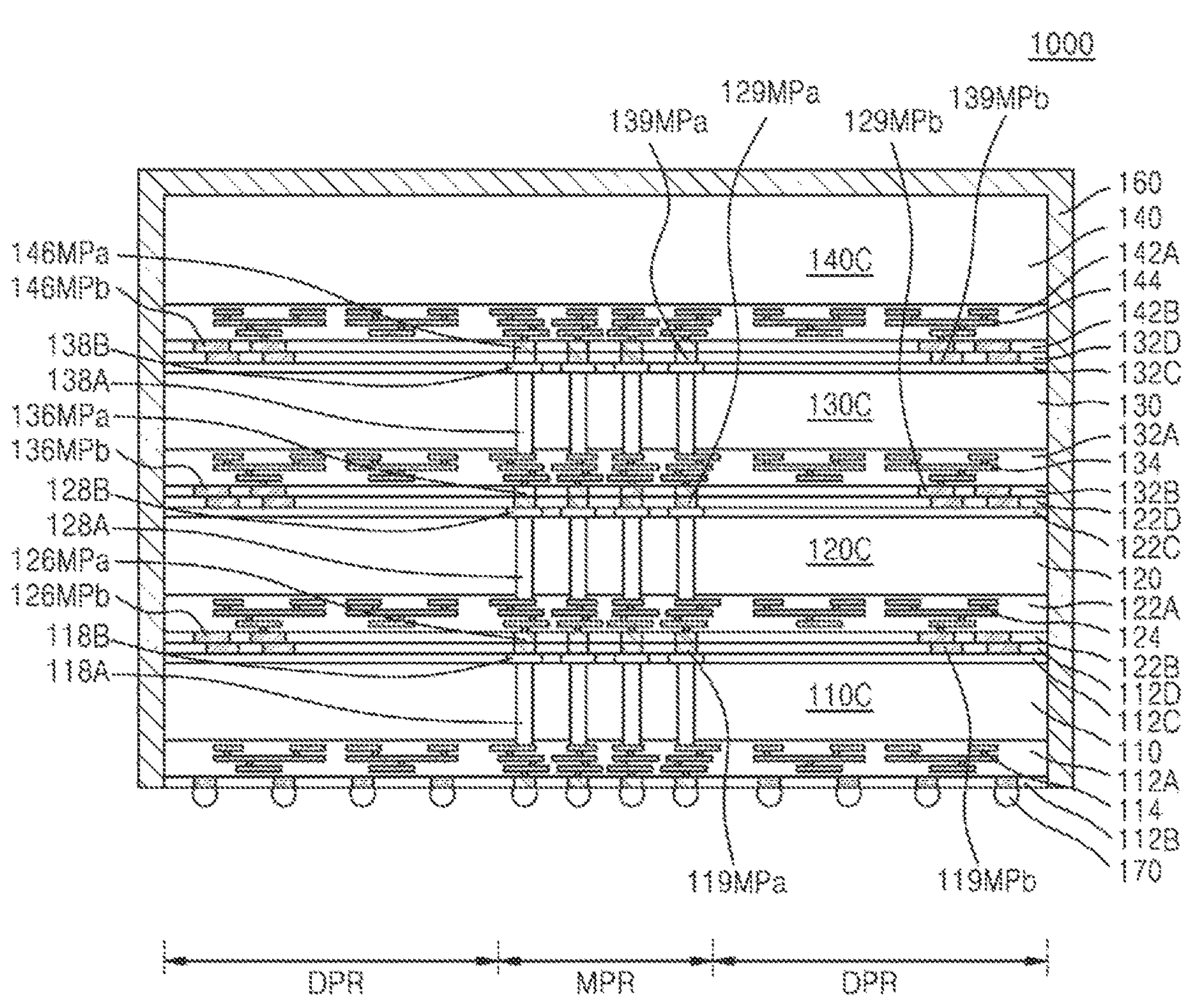
FIG. 15 is a cross-sectional view illustrating a semiconductor package according to some embodiments.

FIG. 15 is a cross-sectional view illustrating a semiconductor package 1000 according to some embodiments.

In detail, the semiconductor package 1000 may include a first chip 110C, a second chip 120C, a third chip 130C, and a fourth chip 140C. The first chip 110C, the second chip 120C, the third chip 130C, and the fourth chip 140C may correspond to the first to sixth semiconductor chips CH1 to CH6 described above. The first chip 110C may include a wiring layer 114 and an interlayer insulation layer 112A each disposed on a first surface of a first substrate 110, and a bonding insulation layer 112B and bonding pads 116MPa and 116MPb may be disposed on the interlayer insulation layer 112A.

The bonding pads 116MPa and 116MPb may respectively be pads which are disposed in a center region and an edge region of the first chip 110C. An upper insulation layer 112C, a bonding insulation layer 112D, and bonding pads 119MPa and 119MPb may be disposed on a second surface of the first substrate 110. The bonding pads 119MPa and 119MPb may respectively be pads which are disposed in the center region and the edge region of the first chip 110C.

Likewise, the second to fourth chips 120C, 130C, and 140C may respectively include wiring layers 124, 134, and 144 and interlayer insulation layers 122A, 132A, and 142A disposed on first surfaces of the second to fourth substrates 120, 130, and 140, and bonding insulation layers 122B, 132B, and 142B and bonding pads 126MPa, 126MPb, 136MPa, 136MPb, 146MPa, and 146MPb may be disposed on the interlayer insulation layers 122A, 132A, and 142A. The bonding pads 126MPa, 136MPa, and 146MPa and the bonding pads 126MPb, 136MPb, and 146MPb may respectively be pads which are disposed in center regions and edge regions of the second to fourth chips 120C, 130C, and 140C.

Upper insulation layers 122C and 132C, bonding insulation layers 122D and 132D, and bonding pads 129MPa, 129MPb, 139MPa, and 139MPb may be disposed on the second surfaces of the second and third substrates 120 and 130. The bonding pads 129MPa and 139MPa and the bonding pads 129MPb and 139MPb may respectively be pads which are disposed in the center regions and the edge regions of the second to fourth chips 120C, 130C, and 140C.

The bonding pads 119MPa, 126MPa, 129MPa, 136MPa, 139MPa, and 146MPa disposed in the center regions of the first to fourth chips 110C, 120C, 130C, and 140C, the bonding pads 119MPb, 126MPb, 129MPb, 136MPb, 139MPb, and 146MPb disposed in the edge regions of the first to fourth chips 110C, 120C, 130C, and 140C, and the bonding insulation layers 112D, 122B, 132B, 142B, 122D, and 132D may be hybrid-bonded to one another.

The bonding pads 119MPb, 126MPb, 129MPb, 136MPb, 139MPb, and 146MPb disposed in the edge regions of the first to fourth chips 110C, 120C, 130C, and 140C may be easily bonded to one another described above, despite being misaligned in a vertical direction.

The first chip 110C may include a through via 118A passing through the first substrate 110 and an upper wiring layer 118B which is disposed on the second surface of the first substrate 110 and connects the through via 118A with a main pad 126MPa. Likewise, the second and third semiconductor chips 120C and 130C may include through vias 128A and 138A passing through the second and third substrates 120 and 130 and upper wiring layers 128B and 138B which are disposed on the second surfaces of the second and third substrates 120 and 130 and connect the through vias 128A and 138A with main pads 136MPa and 146MPa, respectively.

A molding member 160 surrounding upper surfaces and side surfaces of the first to fourth chips 110C, 120C, 130C, and 140C may be provided. A connection bump 170 may be attached on the bonding pads disposed on the first surface 116MPa and 116MPb of the first chip 110C. The molding member 160 may include an epoxy mold compound (EMC), but in some embodiments, the molding member 160 may cover only the side surfaces of the first to fourth chips 110C, 120C, 130C, and 140C or may be omitted.

In some embodiments, the first to fourth chips 110C, 120C, 130C, and 140C may each be a memory chip or a logic chip. For example, all of the first to fourth chips 110C, 120C, 130C, and 140C may be the same kind of memory chips, or at least one of the first to fourth chips 110C, 120C, 130C, and 140C may be a logic chip and the other of the first to fourth chips 110C, 120C, 130C, and 140C may be a memory chip.

Figure 16:
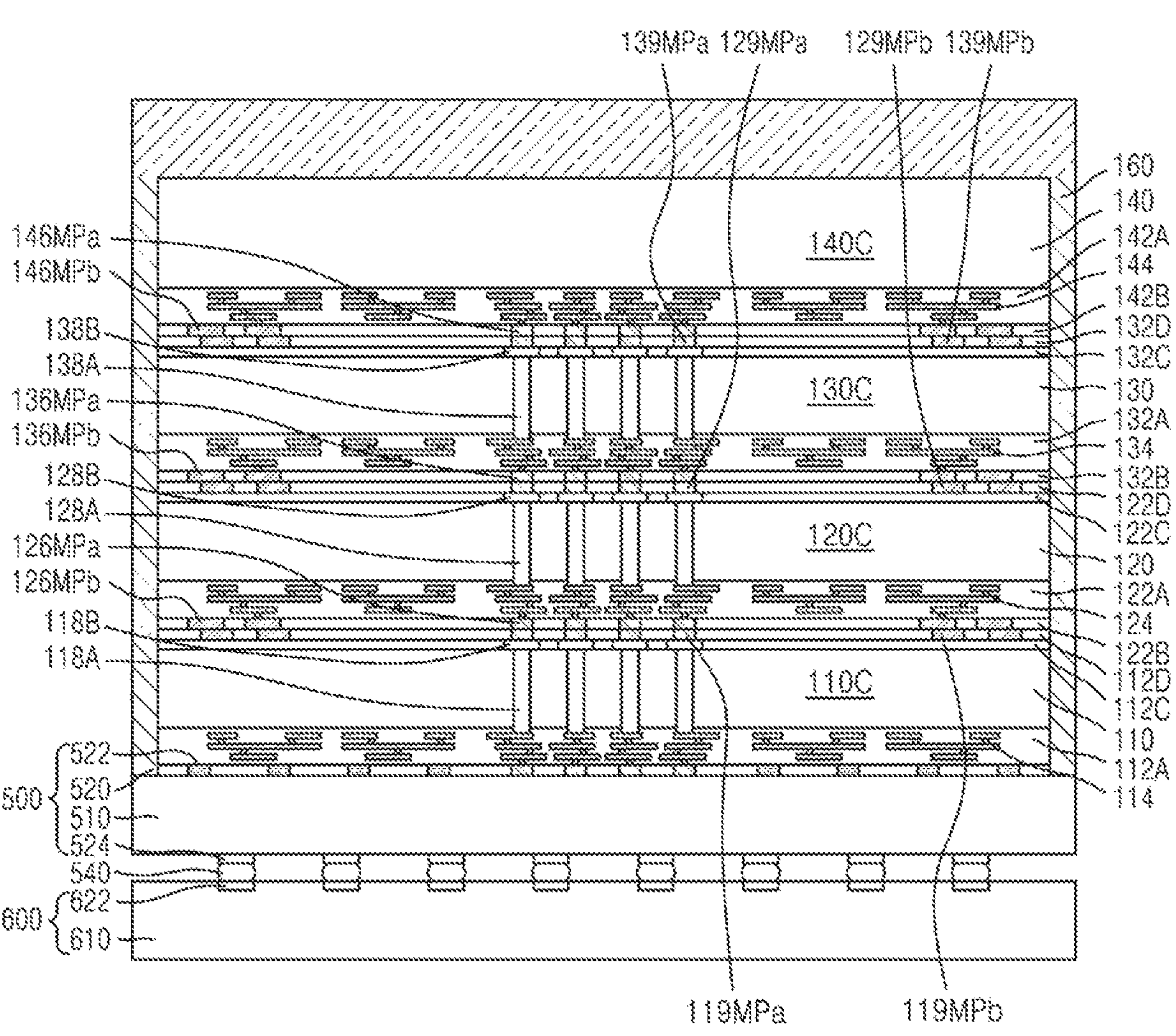
FIG. 16 is a cross-sectional view illustrating a semiconductor package according to some embodiments.

FIG. 16 is a cross-sectional view illustrating a semiconductor package 1000A according to some embodiments.

In detail, except for that the semiconductor package 1000A includes an interposer 500 and a main board 600, the semiconductor package 1000A may be almost the same as the semiconductor package 1000 of FIG. 15. In FIG. 16, the descriptions repetitive of those related to FIG. 15 are omitted for conciseness.

The interposer 500 may include a base layer 510, a redistribution layer 520, a first top pad 522, and a first bottom pad 524. A through via (not shown) electrically connecting the first top pad 522 with the first bottom pad 524 may be further provided in the base layer 510. The interposer 500 and the first chip 110C may be attached on each other through metal-oxide hybrid bonding by using the first top pad 522. On the other hand, the interposer 500 and the first chip 110C may be connected with each other through a connection bump (not shown).

The main board 600 may include a base board layer 610 and a second top pad 622, and the first bottom pad 524 of the interposer 500 may be electrically connected with a second top pad 622 of the main board 600 by a board connection terminal 540. A heat dissipation member 700 may be further provided on the fourth semiconductor chip 140C.

Figure 17:
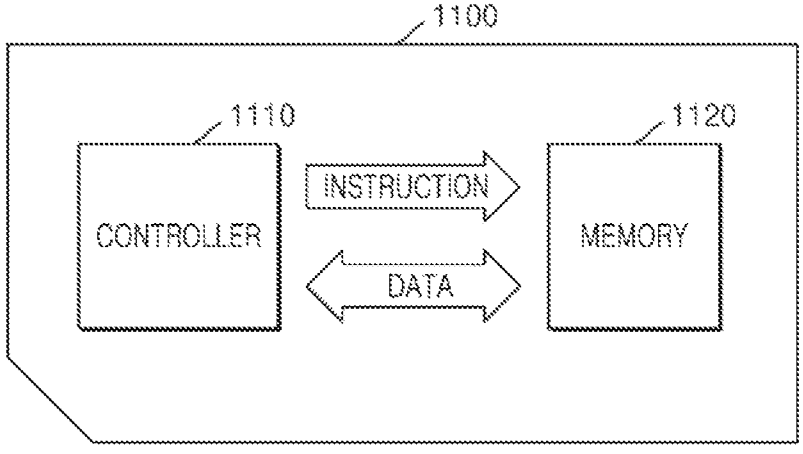
FIG. 17 is a block diagram schematically illustrating a memory card to which a semiconductor package according to some embodiments is applied.

FIG. 17 is a block diagram schematically illustrating a memory card 1100 to which a semiconductor package according to some embodiments is applied.

In detail, a controller 1110 and a memory 1120 may be disposed to exchange an electrical signal in the memory card 1100. For example, when the controller 1110 issues an instruction, the memory 1120 may transfer data. The controller 1110 and/or the memory 1120 may include a semiconductor package according to one of embodiments described above with respect to FIGS. 1-14. The memory 1120 may include a memory array (not shown) or a memory array bank (not shown).

The memory card 1100 may be used in various kinds of cards (for example, a memory device such as a memory stick card, a smart media card (SM), a secure digital (SD) card, a mini secure digital card (mini SD), or a multimedia card (MMC)).

Figure 18:
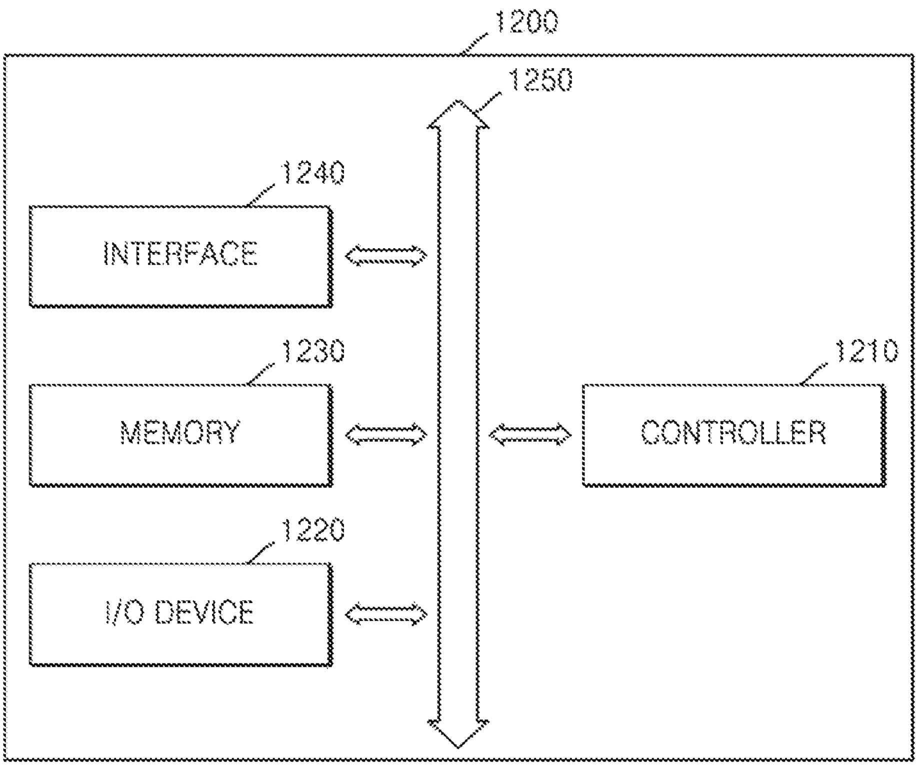
FIG. 18 is a block diagram schematically illustrating an electronic system to which a semiconductor package according to some embodiments is applied.

FIG. 18 is a block diagram schematically illustrating an electronic system 1200 to which a semiconductor package according to some embodiments is applied.

In detail, the electronic system 1200 may include a controller 1210, an input/output (I/O) device 1220, a memory 1230, and an interface 1240. The electronic system 1200 may be a mobile system or a system, which transfers or receives information. The mobile system may be a personal digital assistant (PDA), a portable computer, a web tablet, a wireless phone, a mobile phone, a digital music player, or a memory card.

The controller 1210 may execute a program and may control the electronic system 1200. The controller 1210 may be a microprocessor, a digital signal processor, a microcontroller, or a device similar thereto. The I/O device 1220 may be used to input or output data of the electronic system 800.

The electronic system 1200 may be connected with an external device (for example, a personal computer or a network) by using the I/O device 1220 and may exchange data with the external device. The I/O device 1220 may be, for example, a keypad, a keyboard, or a display. The memory 1230 may store a code and/or data for an operation of the controller 1210, and/or may store data obtained through processing by the controller 1210.

The controller 1210 and/or the memory 1230 may include a semiconductor package according to one of embodiments described above with respect to FIGS. 1-14. The interface 1240 may be a data transfer path between the electronic system 1200 and another external device. The controller 1210, the I/O device 1220, the memory 1230, and the interface 1240 may communicate with one another through a bus 1250.

For example, the electronic system 1200 may be used in a mobile phone, an MP3 player, a navigation device, a portable multimedia player (PMP), a solid state disk (SSD), or household appliances.

Hereinabove, exemplary embodiments have been described in the drawings and the specification. Embodiments have been described by using the terms described herein, but this has been merely used for describing the inventive concept and has not been used for limiting a meaning or limiting the scope of the inventive concept defined in the following claims. Therefore, it may be understood by those of ordinary skill in the art that various modifications and other equivalent embodiments may be implemented from the present disclosure. Accordingly, the spirit and scope of the various embodiments may be defined based on the spirit and scope of the following claims.

While various embodiments have been particularly shown and described with reference to the drawings, it will be understood that various changes in form and details may be made therein without departing from the spirit and scope of the following claims.

What is claimed is:

1. A semiconductor package comprising:

a lower chip including a lower bonding insulation layer, a first lower bonding pad, and a second lower bonding pad; and an upper chip disposed on the lower chip, the upper chip including an upper bonding insulation layer, a first upper bonding pad, and a second upper bonding pad respectively hybrid-bonded to the lower bonding insulation layer, the first lower bonding pad, and the second lower bonding pad, wherein each of the first lower bonding pad and the first upper bonding pad have a first shape in which a first axis length is the same as a second axis length, and the first lower bonding pad and the first upper bonding pad are disposed one-dimensionally or planarily in a first center region which is near a center point of the lower chip and the upper chip, each of the second lower bonding pad and the second upper bonding pad have a second shape in which a third axis length differs from a fourth axis length, and the second lower bonding pad and the second upper bonding pad are disposed one-dimensionally or planarily in a first edge region which is near a corner point of the lower chip and the upper chip, and the third axis length is greater than the first axis length, and in the second lower bonding pad and the second upper bonding pad disposed in the first edge region, the third axis length is arranged in a direction perpendicular to a radial direction from the center point.

2. The semiconductor package of claim 1, wherein the first shape is a circular shape, and the second shape is an oval shape.

3. The semiconductor package of claim 1, wherein the first shape is a tetragonal shape, and the second shape is a rectangular shape.

4. The semiconductor package of claim 1, wherein a ratio of the fourth axis length to the third axis length is 1:1.5 to 1:15.

5. The semiconductor package of claim 1, wherein the second lower bonding pad of the first edge region is partially staggered with respect to the second upper bonding pad of the first edge region.

6. The semiconductor package of claim 5, wherein one of the second lower bonding pad and the second upper bonding pad of the first edge region is rotated clockwise or counter-clockwise with respect to the center point.

7. The semiconductor package of claim 5, wherein one of the second lower bonding pad and the second upper bonding pad of the first edge region is offset in an X direction or a Y direction with respect to the center point.

8. The semiconductor package of claim 1, wherein the second lower bonding pad and the second upper bonding pad of the first edge region are vertically and partially staggered.

9. The semiconductor package of claim 1, wherein the first lower bonding pad and the first upper bonding pad of the first center region are bonded to each other to form a first hybrid bonding portion, the second lower bonding pad and the second upper bonding pad of the first edge region are bonded to each other to form a second hybrid bonding portion, and the lower bonding insulation layer and the upper bonding insulation layer are bonded to each other to form a third hybrid bonding portion.

10. The semiconductor package of claim 1, wherein the lower chip further includes a third lower bonding pad and the upper chip further includes a third upper bonding pad, each of the third lower bonding pad and the third upper bonding pad have the second shape in which the third axis length differs from the fourth axis length, the third lower bonding pad and the third upper bonding pad being disposed one-dimensionally or planarily in a second edge region which is adjacent to edges of the lower chip and the upper chip, and in the third lower bonding pad and the third upper bonding pad of the second edge region, the third axis length is arranged in an X direction or a Y direction from the center point.

11. The semiconductor package of claim 1, wherein the lower chip and the upper chip further comprise a third edge region in which a fourth lower bonding pad and a fourth upper bonding pad each having the second shape in which the third axis length differs from the fourth axis length are disposed, the third edge region being disposed at a perimeter of the first center region and between the first center region and the first edge region, and the third axis length of the fourth lower bonding pad and the fourth upper bonding pad increases progressively toward the first edge region in the radial direction from the third edge region.

12. The semiconductor package of claim 1, wherein the lower chip and the upper chip further comprise a second center region in which a fifth lower bonding pad and a fifth upper bonding pad, each having the first shape in which the first axis length is the same as the second axis length are disposed, the second center region being disposed at a perimeter of the first center region and between the first center region and the first edge region, and the lower chip and the upper chip further comprise a fourth edge region in which a sixth lower bonding pad and a sixth upper bonding pad, each having the second shape in which the third axis length differs from the fourth axis length are disposed, and the sixth lower bonding pad and the sixth upper bonding pad are disposed at a perimeter of the second center region.

13. A semiconductor package comprising:

a lower chip including a lower bonding insulation layer, a first lower bonding pad, and a second lower bonding pad; and an upper chip disposed on the lower chip, the upper chip including an upper bonding insulation layer, a first upper bonding pad, and a second upper bonding pad respectively hybrid-bonded to the lower bonding insulation layer, the first lower bonding pad, and the second lower bonding pad, wherein the first lower bonding pad and the first upper bonding pad each have a circular shape and are one-dimensionally or planarily arranged in a first center region that is disposed near a center point of the lower chip and the upper chip, the second lower bonding pad and the second upper bonding pad each having an oval shape are one-dimensionally or planarily arranged in a perpendicular direction, which is perpendicular to a radial direction from the center point, the second lower bonding pad and the second upper bonding pad being disposed in a first edge region that is disposed near corner points of the lower chip and the upper chip, and a long-axis length of the oval shape is greater than a diameter of the circular shape, and the second lower bonding pad and the second upper bonding pad of the first edge region are arranged to be one-dimensionally or planarily staggered, and partially staggered in the perpendicular direction perpendicular to the radial direction from the center point.

14. The semiconductor package of claim 13, wherein the first lower bonding pad and the first upper bonding pad of the first center region are vertically aligned and disposed, and the second lower bonding pad and the second upper bonding pad of the first edge region are arranged to be vertically and partially staggered.

15. The semiconductor package of claim 13, wherein a third lower bonding pad and a third upper bonding pad each having the oval shape are further disposed one-dimensionally or planarily in a second edge region which is adjacent to edges of the lower chip and the upper chip, and in the third lower bonding pad and the third upper bonding pad of the second edge region, the long-axis length of the oval shape is one-dimensionally or planarily arranged in an X direction or a Y direction from the center point.

16. The semiconductor package of claim 13, wherein the lower chip and the upper chip further comprise a third edge region in which a fourth lower bonding pad and a fourth upper bonding pad each having the oval shape are disposed at a perimeter of the first center region and between the first center region and the first edge region, and the long-axis length of the oval shape of the fourth lower bonding pad and the fourth upper bonding pad increases progressively toward the first edge region in the radial direction from the third edge region.

17. The semiconductor package of claim 13, wherein the lower chip and the upper chip further comprise a second center region in which a fifth lower bonding pad and a fifth upper bonding pad each having the circular shape are disposed at a perimeter of the first center region and between the first center region and the first edge region, and the lower chip and the upper chip further comprise a fourth edge region in which a sixth lower bonding pad and a sixth upper bonding pad each having the oval shape are disposed at a perimeter of the second center region.

18. A semiconductor package comprising:

a lower chip including a lower bonding insulation layer, a first lower bonding pad, and a second lower bonding pad; and an upper chip disposed on the lower chip, the upper chip including an upper bonding insulation layer, a first upper bonding pad, and a second upper bonding pad respectively hybrid-bonded to the lower bonding insulation layer, the first lower bonding pad, and the second lower bonding pad, wherein the first lower bonding pad and the first upper bonding pad each having a tetragonal shape are one-dimensionally or planarily arranged in a first center region that is disposed near a center point of the lower chip and the upper chip, the second lower bonding pad and the second upper bonding pad each having a rectangular shape are one-dimensionally or planarily arranged in a perpendicular direction, which is perpendicular to a radial direction from the center point, the second lower bonding pad and the second upper bonding pad being disposed in a first edge region that is disposed near corner points of the lower chip and the upper chip, and a long-axis length of the rectangular shape is greater than an axis length of the tetragonal shape, and the second lower bonding pad and the second upper bonding pad of the first edge region are arranged to be one-dimensionally or planarily staggered, and partially staggered in the perpendicular direction perpendicular to the radial direction from the center point.

19. The semiconductor package of claim 18, wherein the lower chip and the upper chip further comprise a third edge region in which a third lower bonding pad and a third upper bonding pad each having the rectangular shape are disposed at a perimeter of the first center region and between the first center region and the first edge region, and the long-axis length of the rectangular shape of the third lower bonding pad and the third upper bonding pad increases progressively toward the first edge region in the radial direction from the third edge region.

20. The semiconductor package of claim 18, wherein the lower chip and the upper chip further comprise a second center region in which a fourth lower bonding pad and a fourth upper bonding pad each having the rectangular shape are disposed at a perimeter of the first center region and between the first center region and the first edge region, and the lower chip and the upper chip further comprise a fourth edge region in which a fifth lower bonding pad and a fifth upper bonding pad each having the rectangular shape are disposed at a perimeter of the second center region.

* * * * *